(12) United States Patent
Little et al.

(10) Patent No.: US 10,396,494 B2
(45) Date of Patent: Aug. 27, 2019

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Joe-Fu Chen, Irvine, CA (US); Qi Zhou, Redmond, WA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/974,674

(22) Filed: May 8, 2018

(65) Prior Publication Data

US 2018/0331468 A1 Nov. 15, 2018

Related U.S. Application Data

(60) Provisional application No. 62/502,802, filed on May 8, 2017, provisional application No. 62/514,974, filed on Jun. 5, 2017.

(51) Int. Cl.
| | |
|---|---|
| *H01R 13/627* | (2006.01) |
| *H01R 13/6582* | (2011.01) |
| *H01R 12/72* | (2011.01) |
| *H01R 12/70* | (2011.01) |
| *H01R 13/62* | (2006.01) |
| *H01R 24/60* | (2011.01) |
| *H05K 1/11* | (2006.01) |
| *H01R 13/642* | (2006.01) |

(52) U.S. Cl.
CPC ..... *H01R 13/6271* (2013.01); *H01R 12/7023* (2013.01); *H01R 12/724* (2013.01); *H01R 13/6205* (2013.01); *H01R 13/6275* (2013.01); *H01R 13/6582* (2013.01); *H01R 13/642* (2013.01); *H01R 24/60* (2013.01); *H05K 1/117* (2013.01); *H05K 2201/10189* (2013.01)

(58) Field of Classification Search
CPC .......................... H01R 11/30; H01R 13/6205; H01R 13/6271; H01R 13/6272
USPC ............................................. 439/38, 39, 357
See application file for complete search history.

(56) References Cited

U.S. PATENT DOCUMENTS

| | | | |
|---|---|---|---|
| 7,445,452 B1 * | 11/2008 | Wu ..................... | H01R 13/6205 439/39 |
| 8,974,126 B2 * | 3/2015 | Sloey .................. | G02B 6/3817 385/93 |
| 9,466,930 B2 * | 10/2016 | Little .................... | H01R 24/60 |

(Continued)

*Primary Examiner* — Hien D Vu
(74) *Attorney, Agent, or Firm* — Wei Te Chung; Ming Chieh Chang

(57) ABSTRACT

An electrical special plug connector includes a mating space, for receiving a mating tongue of a complementary receptacle connector, with a corresponding latch extending thereinto, and further equipped with a moveable actuator to move a corresponding latch away from the mating space toward an outer position when said actuator is affected by magnetic forces derived from a special receptacle connector equipped with a magnet so as to have the special plug connector mated with the special receptacle connector with magnetic forces while keeping the corresponding latch in an inner position to interlock with a locking notch of a standard type C receptacle connector.

11 Claims, 34 Drawing Sheets

(56) References Cited

U.S. PATENT DOCUMENTS 9,502,827 B2 * 11/2016 Feng .................. H01R 13/6581
9,525,227 B2 * 12/2016 Little ................. H01R 13/6273
9,853,399 B2 * 12/2017 Kao ................... H01R 13/6585

* cited by examiner

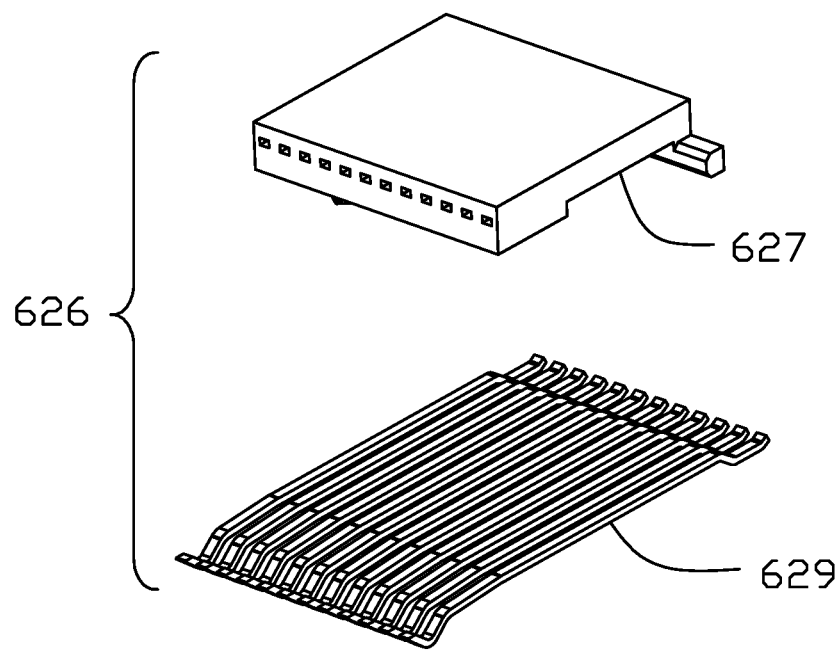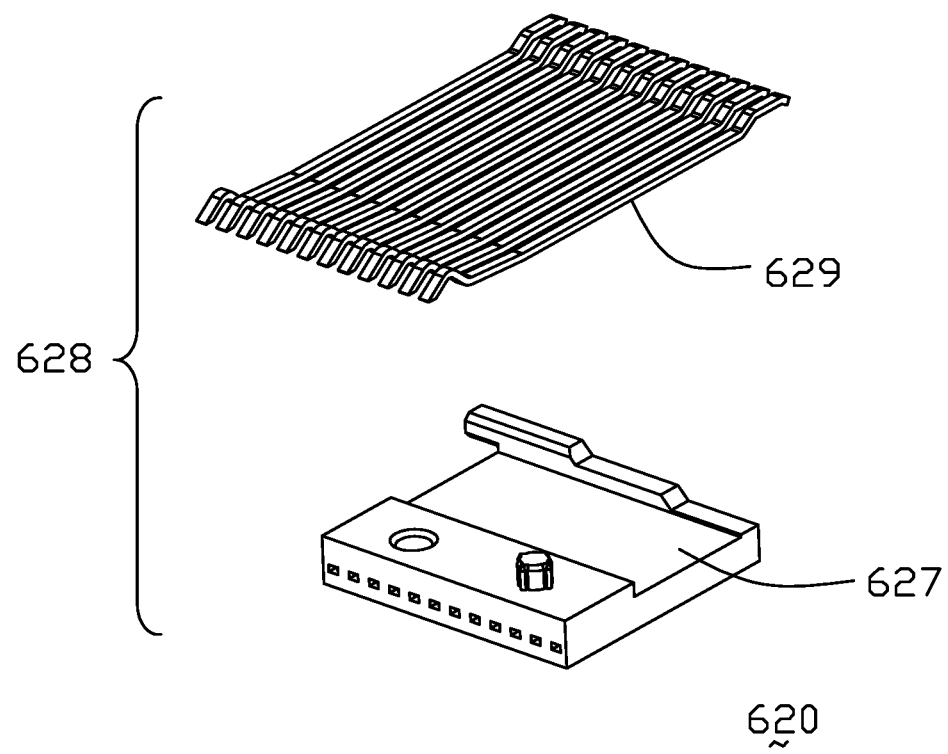
FIG. 8

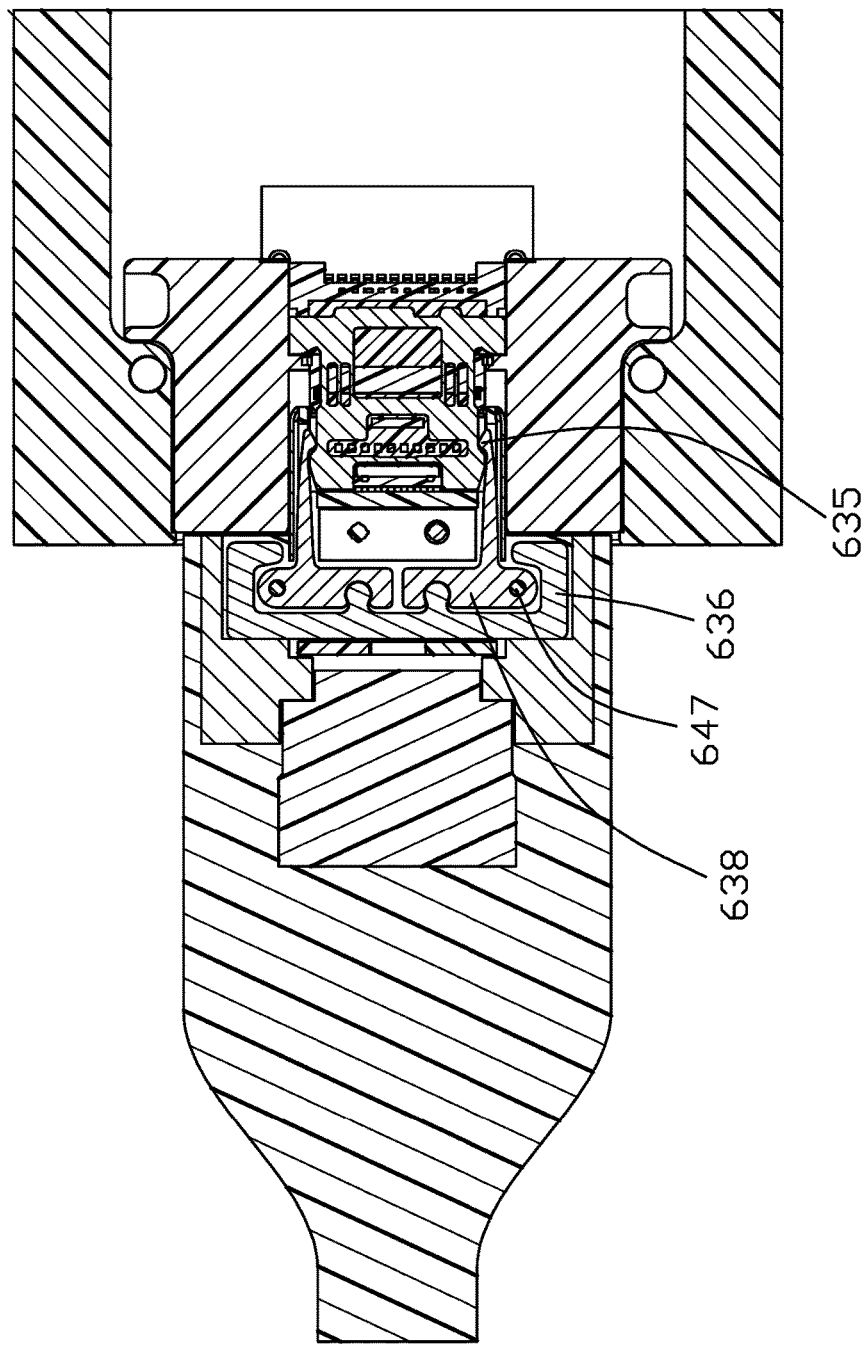

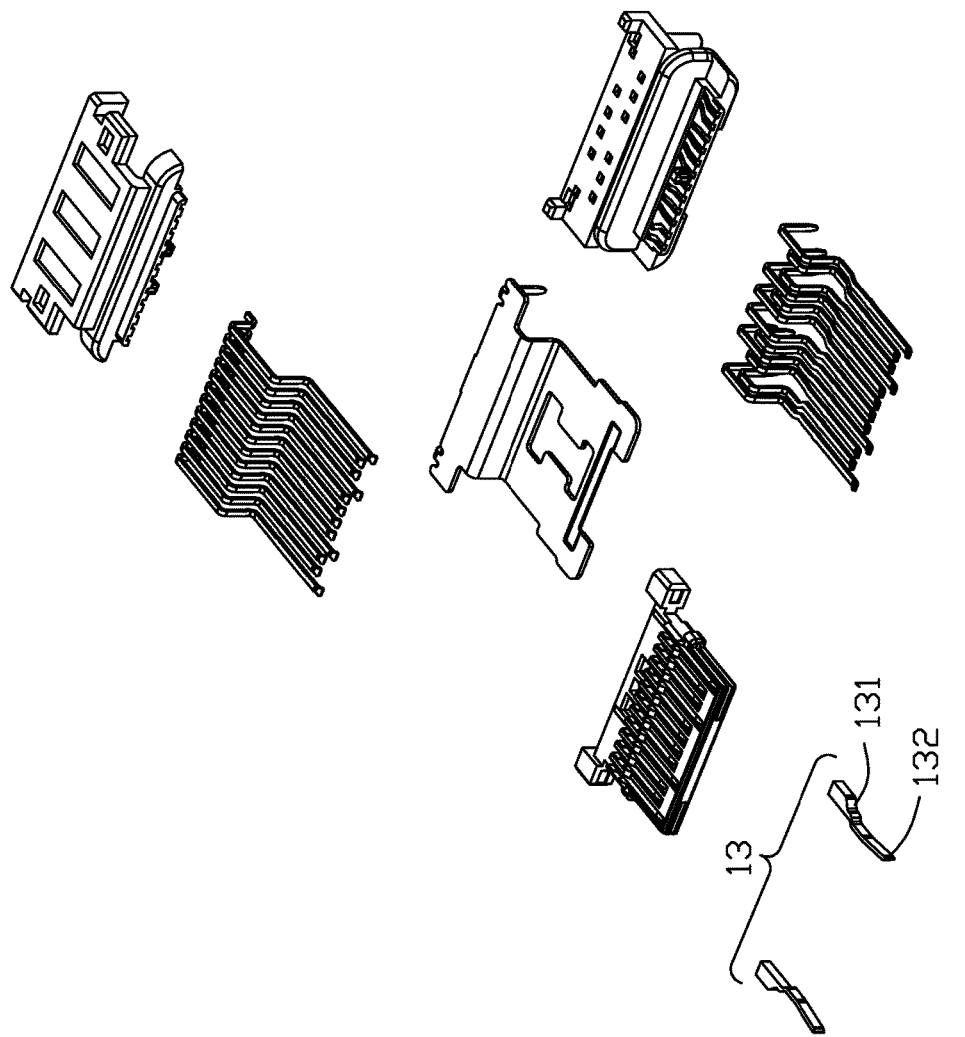

FLIPPABLE ELECTRICAL CONNECTOR

CROSS REFERENCE TO RELATED APPLICATIONS

This instant application claims the benefit of, and priority to, U.S. Provisional Patent Application No. 62/502,802, filed May 8, 2017, No. 62/514,974, filed Jun. 5, 2017, the contents of which are incorporated entirely herein by reference.

BACKGROUND OF THE INVENTION

1. Field of the Invention

The present invention relates to an electrical connector, and more particularly to a special flappable plug connector used with a special receptacle connector which are configured similar to a standard type C plug and receptacle connectors.

2. The Related Art

The Type C electrical connectors are more and more popular. Anyhow, an improved arrangement is confidentially desired to provide the special plug connector and special receptacle connector which may comply with the mating interface of the standard type C receptacle connector and plug connector while equipped with magnetic mechanism for retention during mating instead of the deflectable latch on the plug connector and the locking notch in the receptacle connector, while at the same time, the special type C plug connector may be mated with the standard type C receptacle connector with retention provided by the latch of the special type C plug connector and the locking notch of the standard type C receptacle connector, and the special type C receptacle connector may be mated with the standard type C plug connector with retention provided by the locking notch of the special type C receptacle connector and the latch of the standard type C plug connector.

SUMMARY OF THE INVENTION accordingly, the object of the present invention is to provide an electrical special plug connector having a similar interface with a standard type C plug connector, special plug connector comprise: a mating space, for receiving a mating tongue of a complementary receptacle connector, with a corresponding latch extending thereinto, and further equipped with a moveable actuator to move a corresponding latch away from the mating space toward an outer position when the actuator is affected by magnetic forces derived from a special receptacle connector equipped with a magnet so as to have the special plug connector mated with the special receptacle connector with magnetic forces with interlocking engagement between the latch and a locking notch of the special receptacle connector while keeping the corresponding latch in an inner position to interlock with a locking notch of a standard type C receptacle connector.

Other objects, advantages and novel features of the disclosure will become more apparent from the following detailed description when taken in conjunction with the accompanying drawings.

BRIEF DESCRIPTION OF THE DRAWINGS

FIG. 8 is an exploded perspective view of the terminal module of the special plug connector of FIG. 7(A);

FIG. 16(A) is a cross-sectional view of the special plug connector of FIG. 3(A) mated with the standard receptacle connector;

FIG. 19 is an exploded perspective view of contact module of the receptacle as shown in FIG. 18.

DETAILED DESCRIPTION OF THE PREFERRED EMBODIMENT

Figure 1:
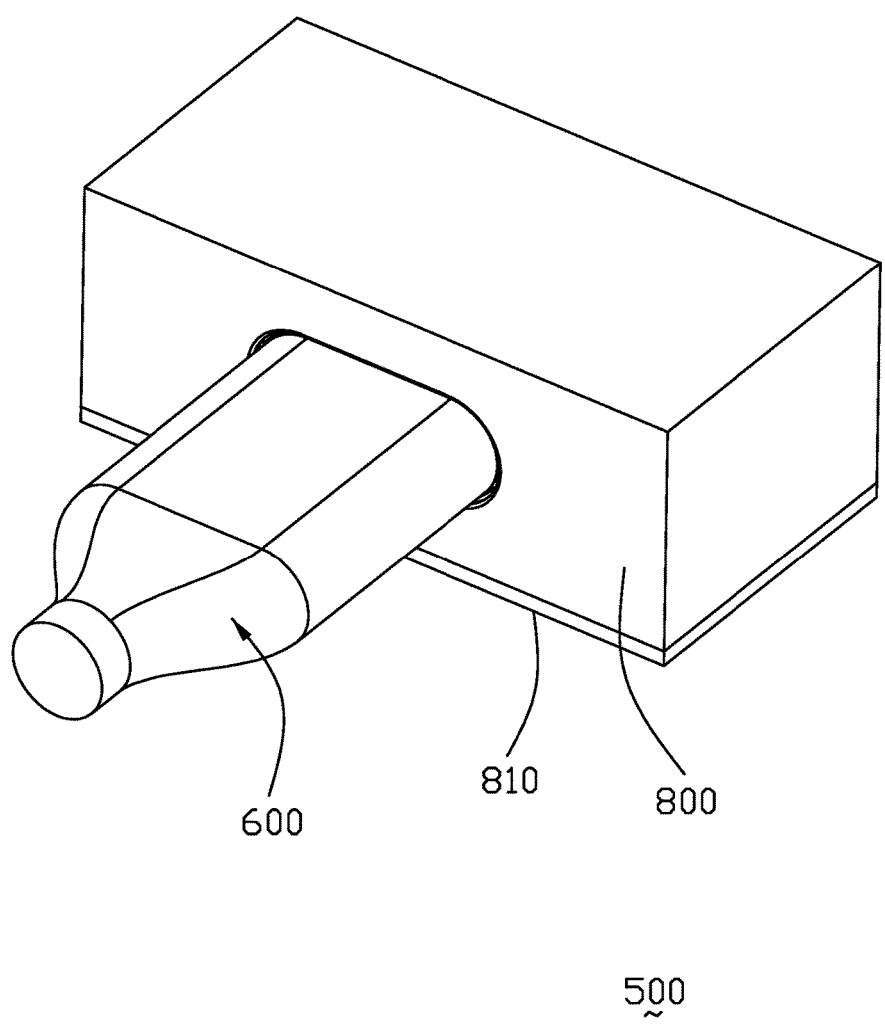
FIG. 1 is a perspective view of an engaged electrical connector assembly of the instant invention according to the a first embodiment, including a special plug connector, and a special receptacle connector mounted upon a printed circuit board and mated with the special plug connector.
Figure 2A:
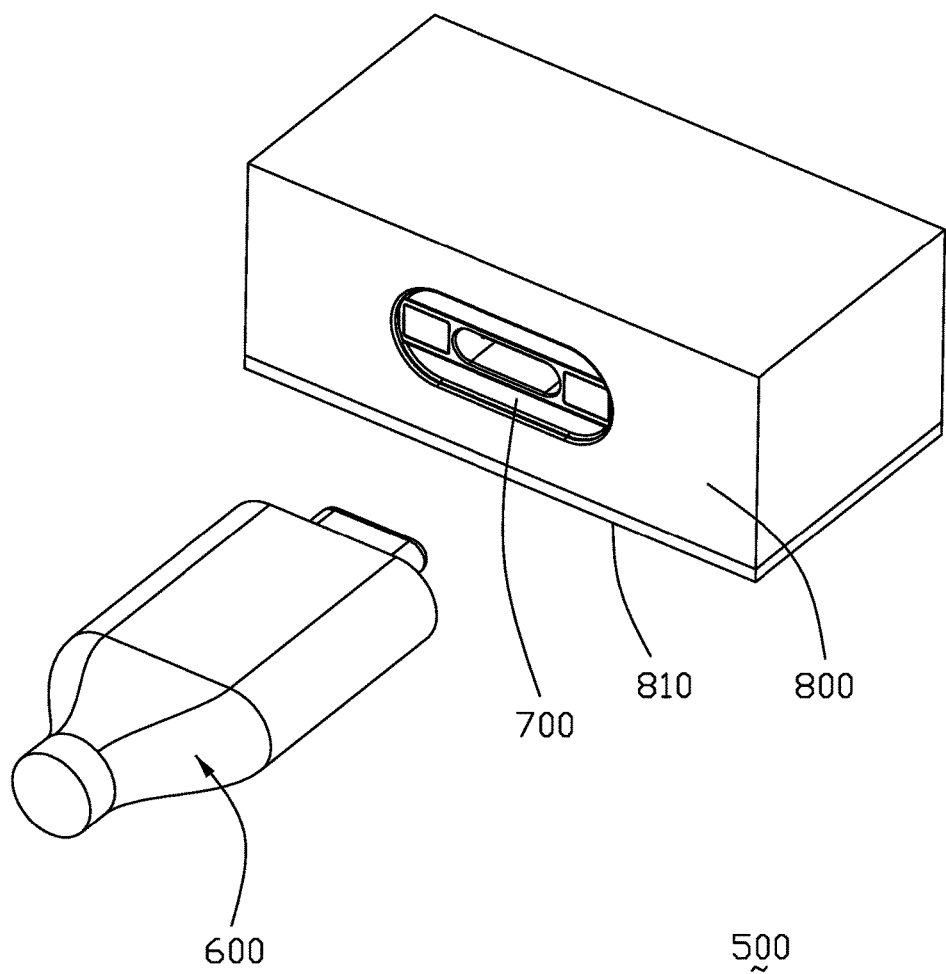
FIG 2(A) is a perspective view of the electrical connector assembly of FIG. 1 to show the special plug connector and the special receptacle connector are separated from each other.
Figure 2B:
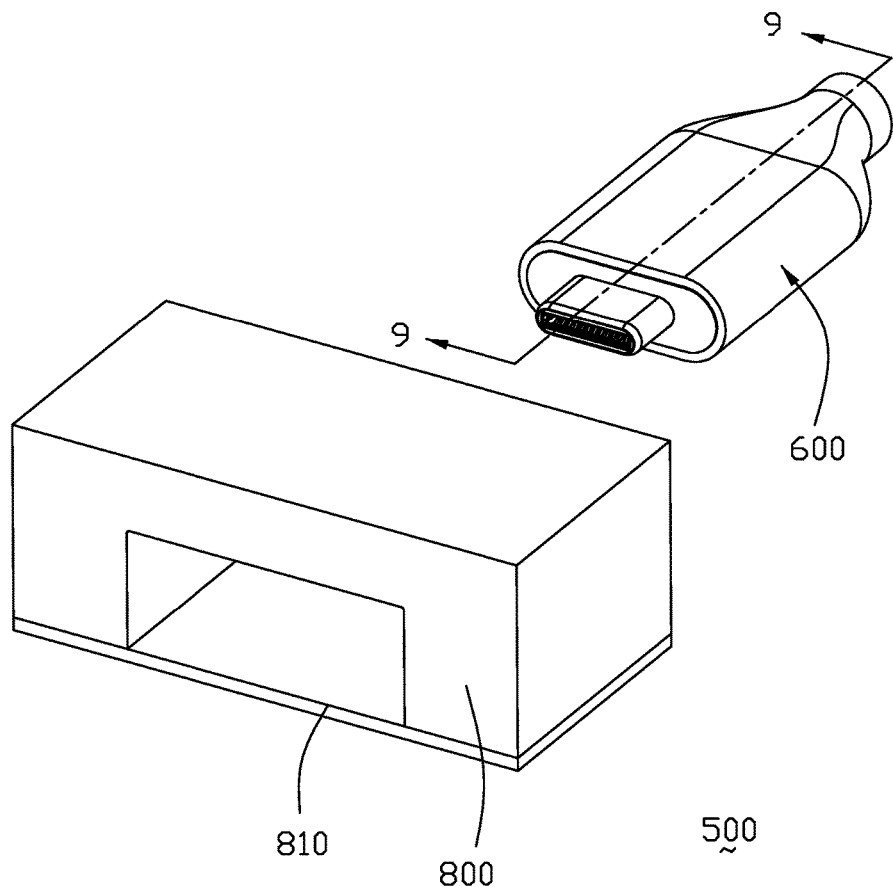
FIG. 2(B) is another perspective view of the electrical connector assembly of FIG. 2(A)
Figure 3A:
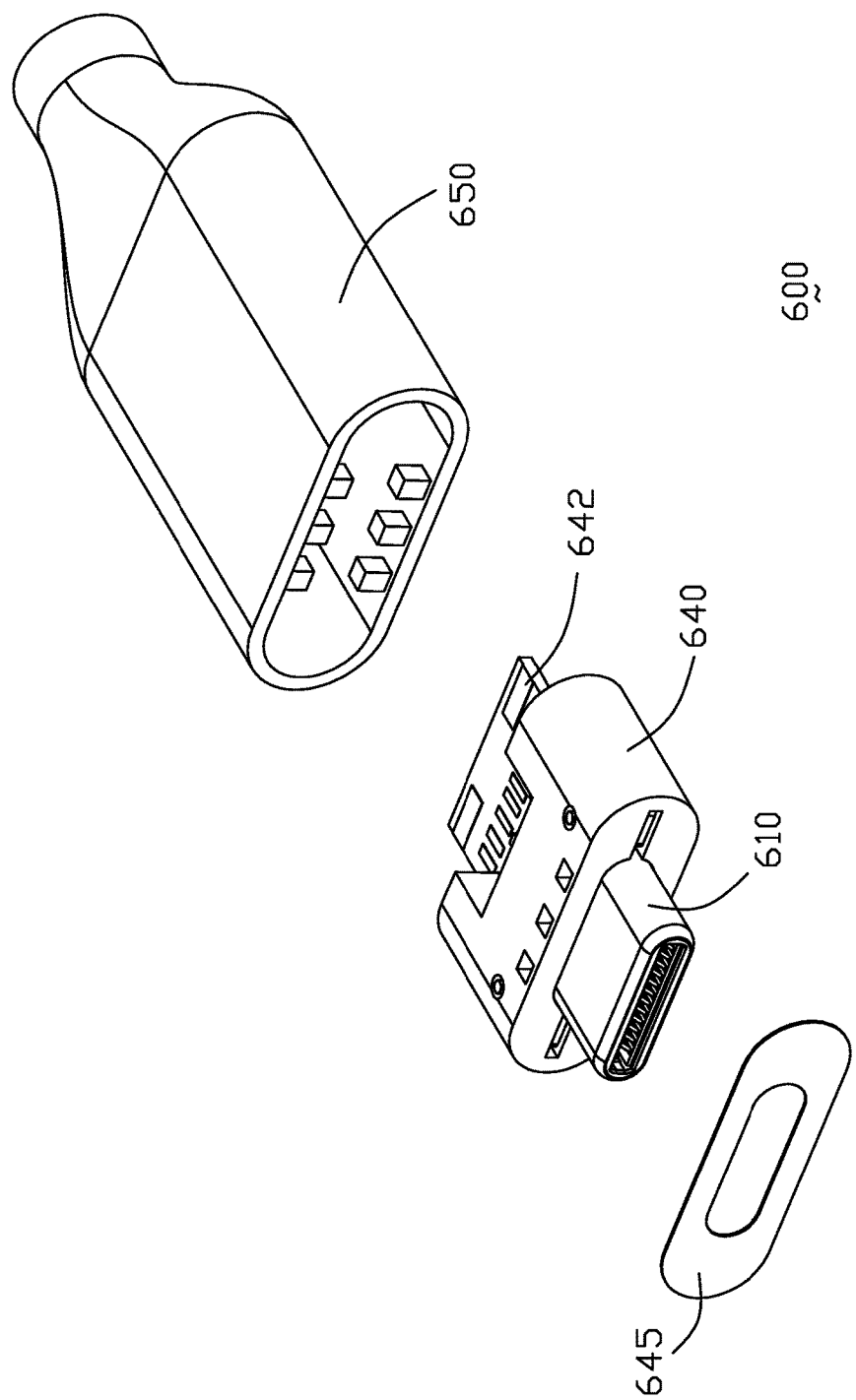
FIG. 3(A) is an exploded perspective view of the special plug connector of the electrical connector assembly of FIG. 1.
Figure 3B:
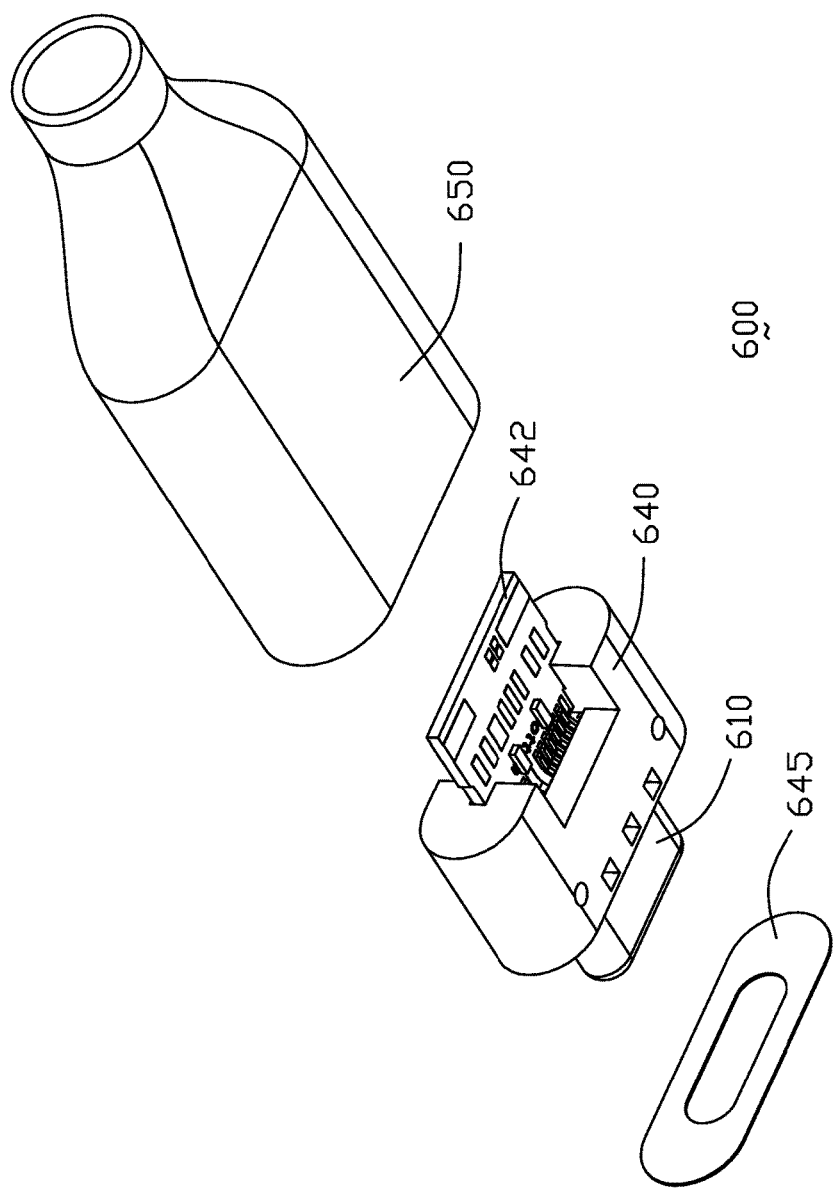
FIG. 3(B) is another exploded perspective view of the special plug connector of the electrical connector assembly of FIG. 1.
Figure 4A:
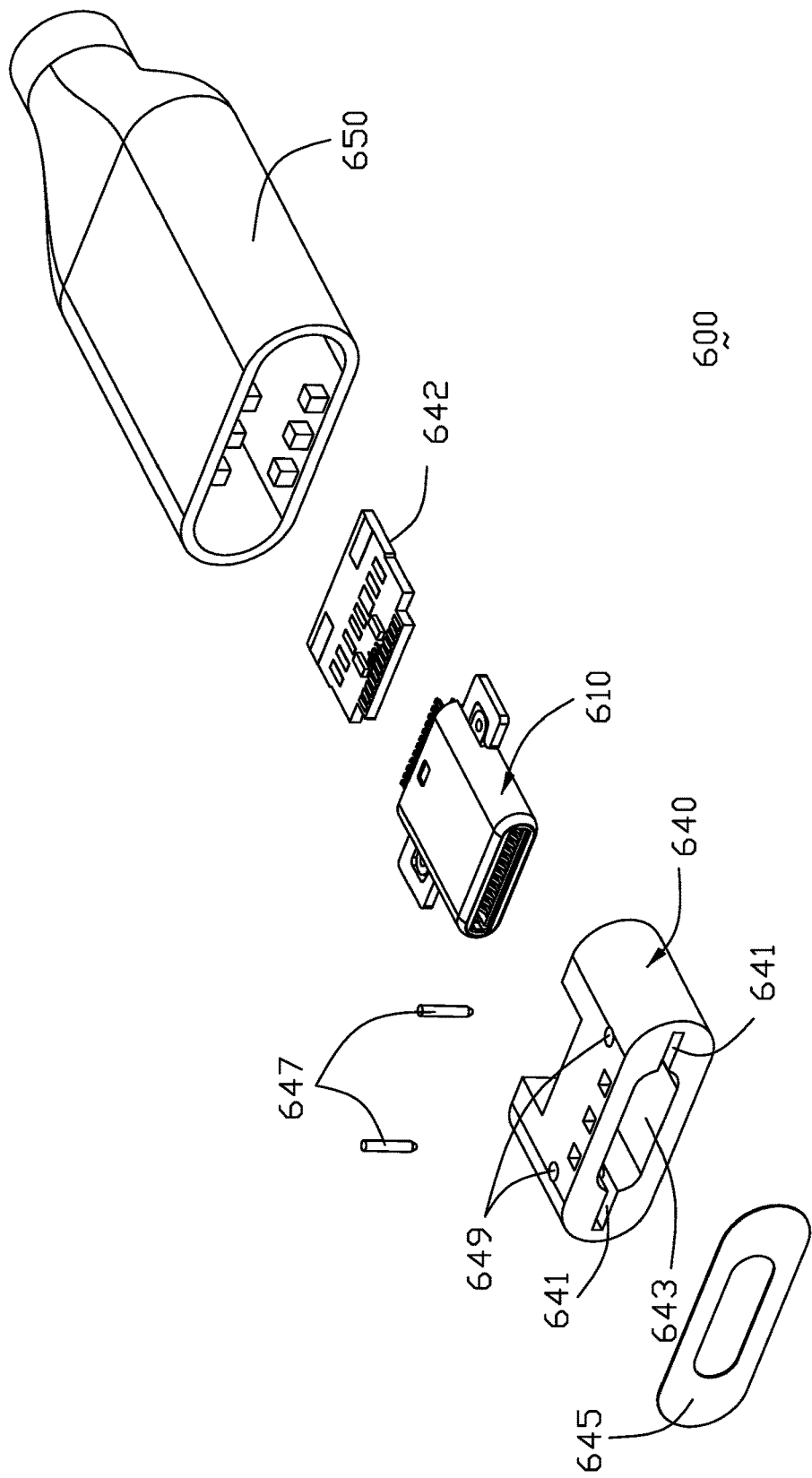
FIG. 4(A) is a further exploded perspective view of the special plug connector of FIG. 3(A)
Figure 4B:
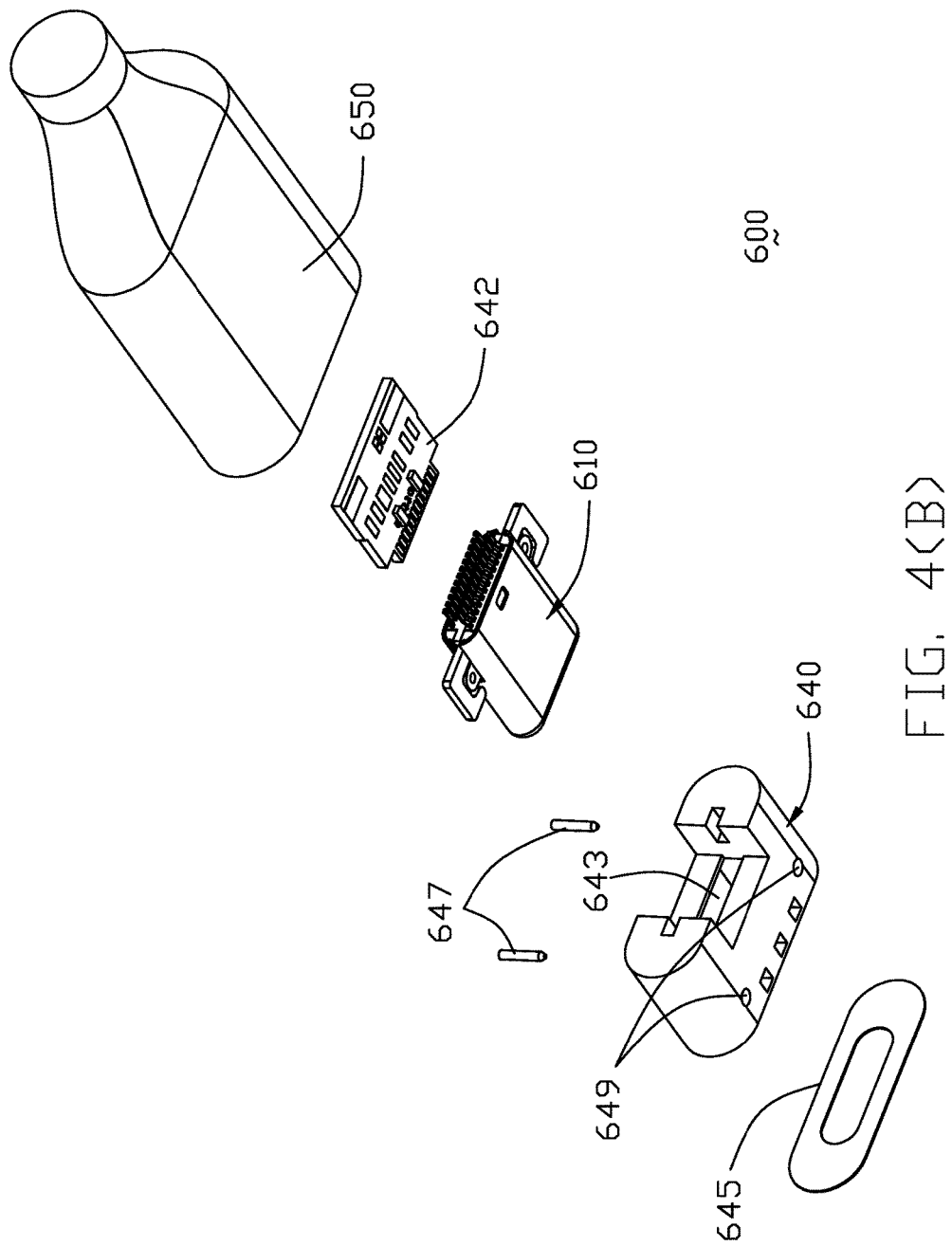
FIG. 4(B) is another further exploded perspective view of the special plug connector of FIG. 3(B)
Figure 5A:
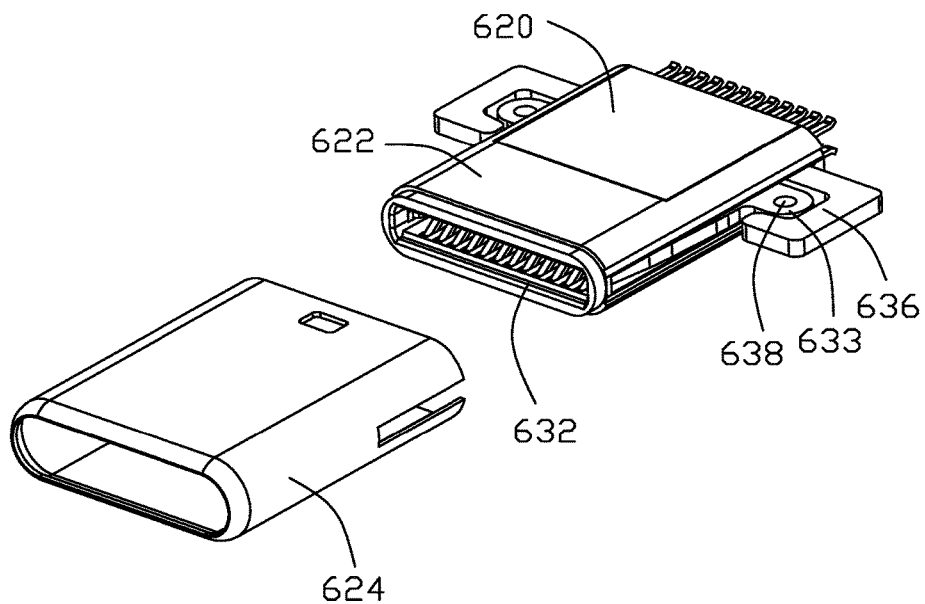
FIG. 5(A) is an exploded perspective view of the mating part of the special plug connector of FIG. 4(A)
Figure 5B:
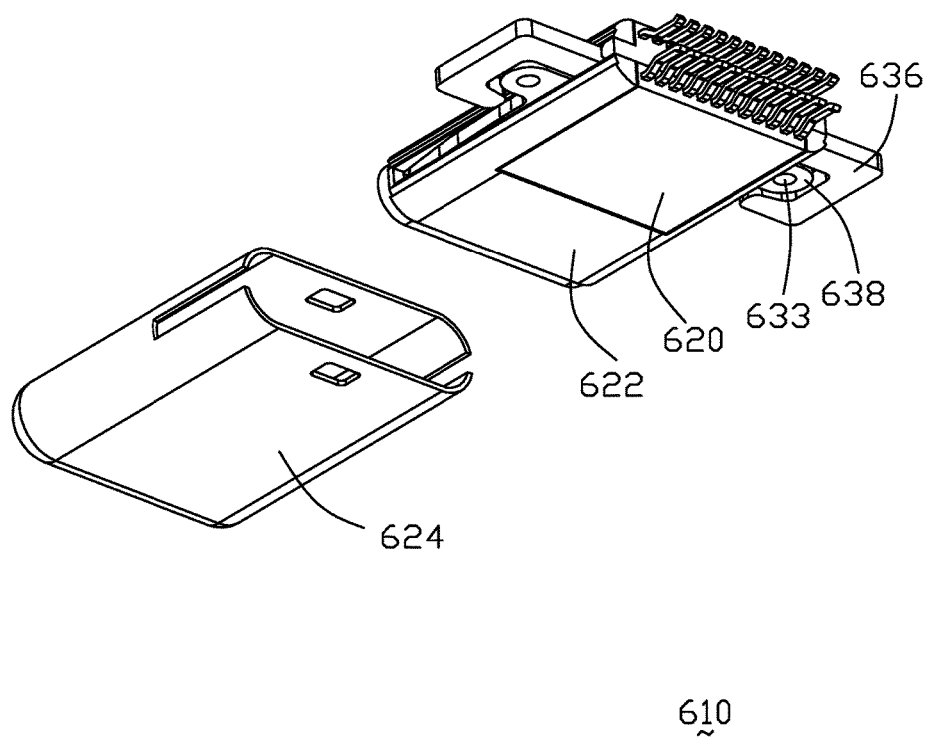
FIG. 5(B) is another exploded perspective view of the mating part of the special plug connector of FIG. 4(A)
Figure 6A:
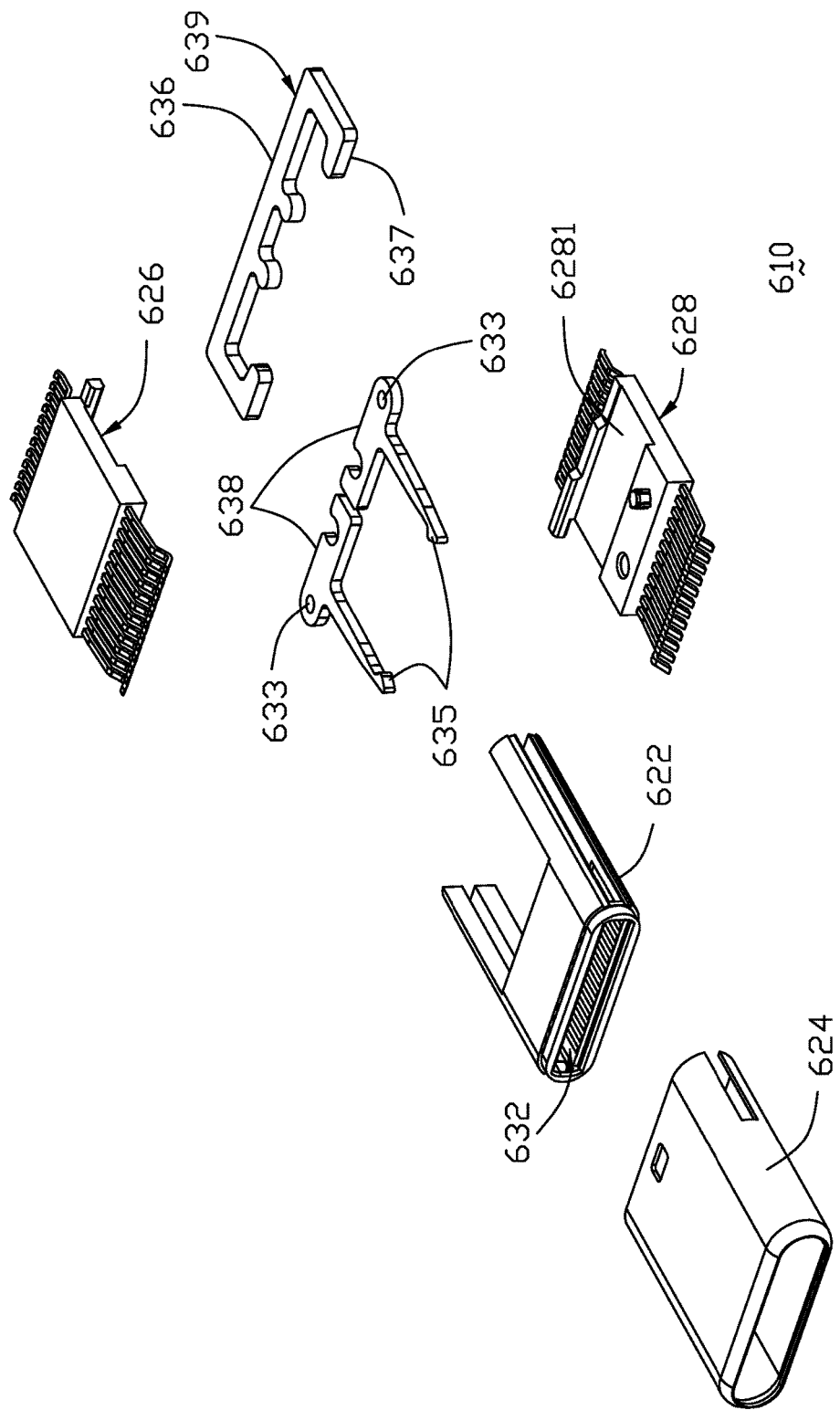
FIG. 6(A) is a further exploded perspective view of the mating part of the special plug connector of FIG. 5(A)
Figure 6B:
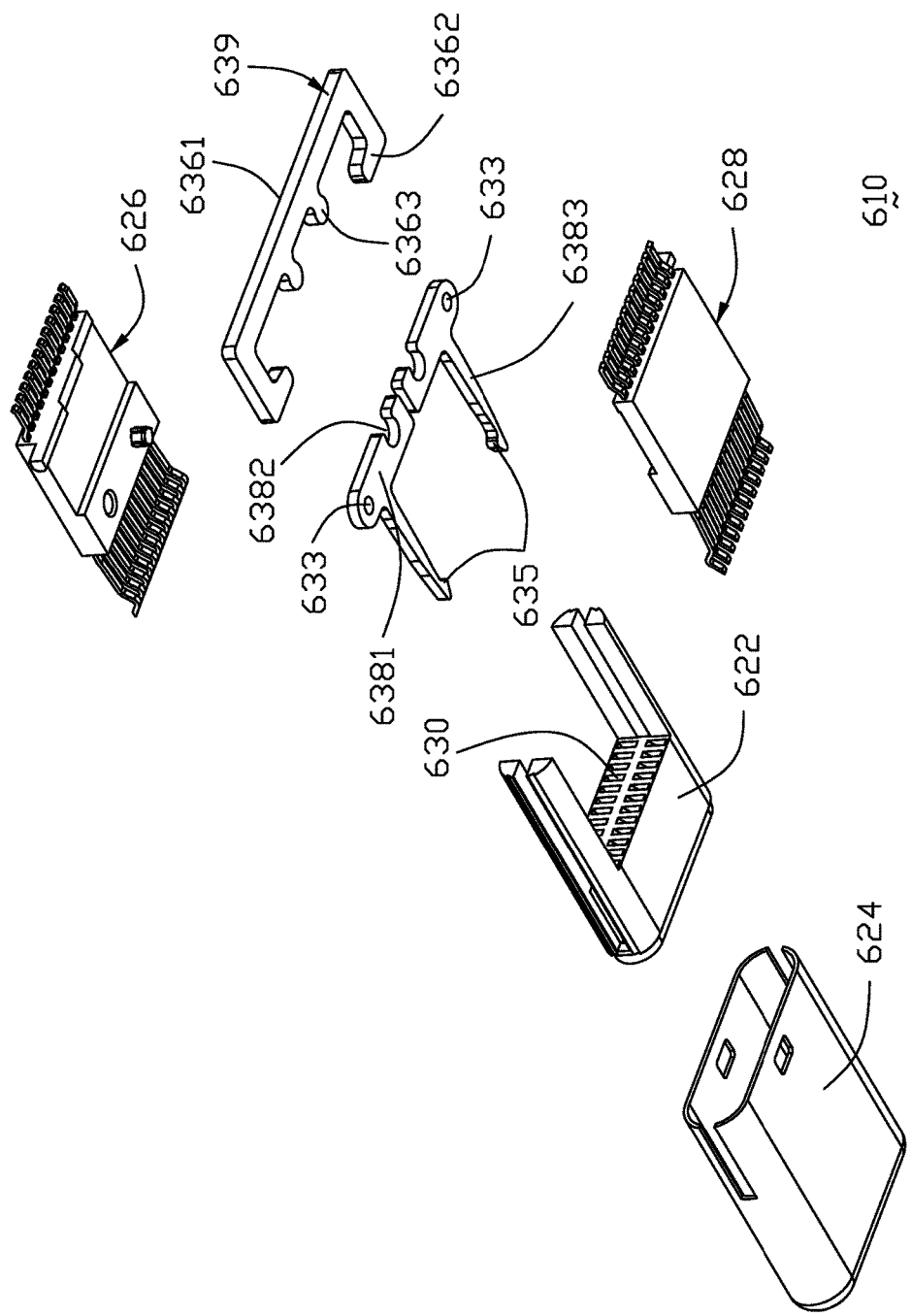
FIG. 6(B) is another further exploded perspective view of the mating part of the special plug connector of FIG. 5(B)
Figure 7A:
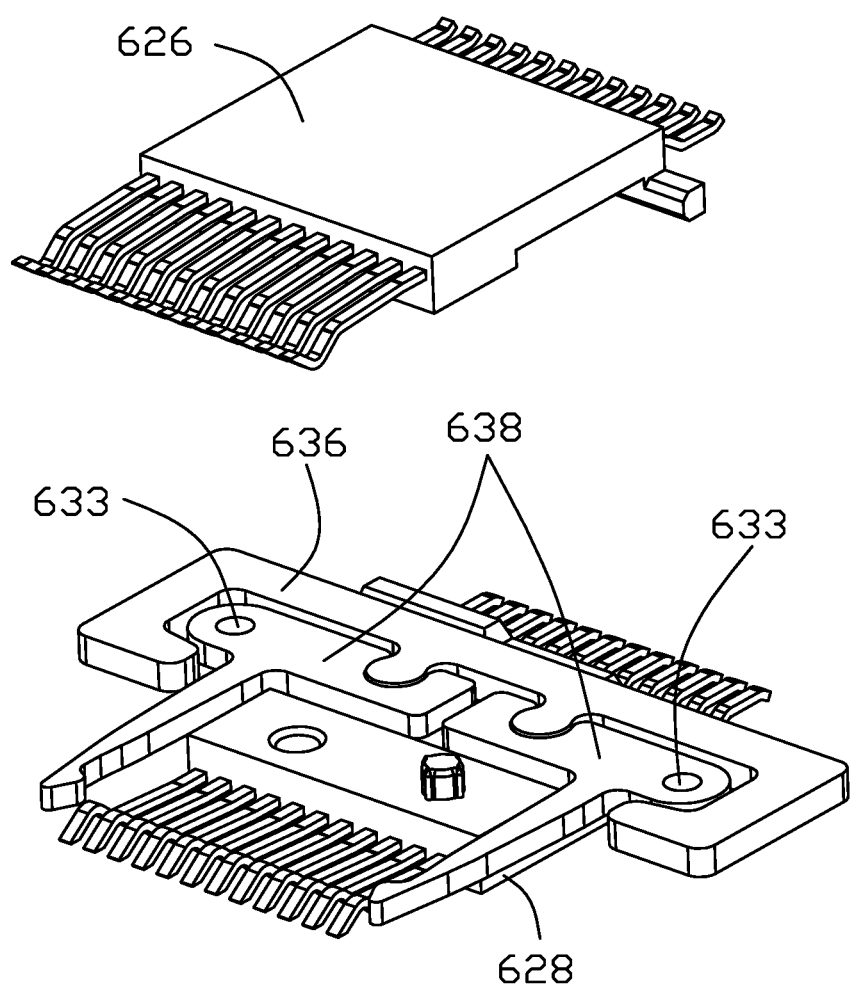
FIG. 7(A) is an exploded perspective view of the terminal module equipped with the actuator and the latches of the special plug connector of FIG. 6(A)
Figure 7B:
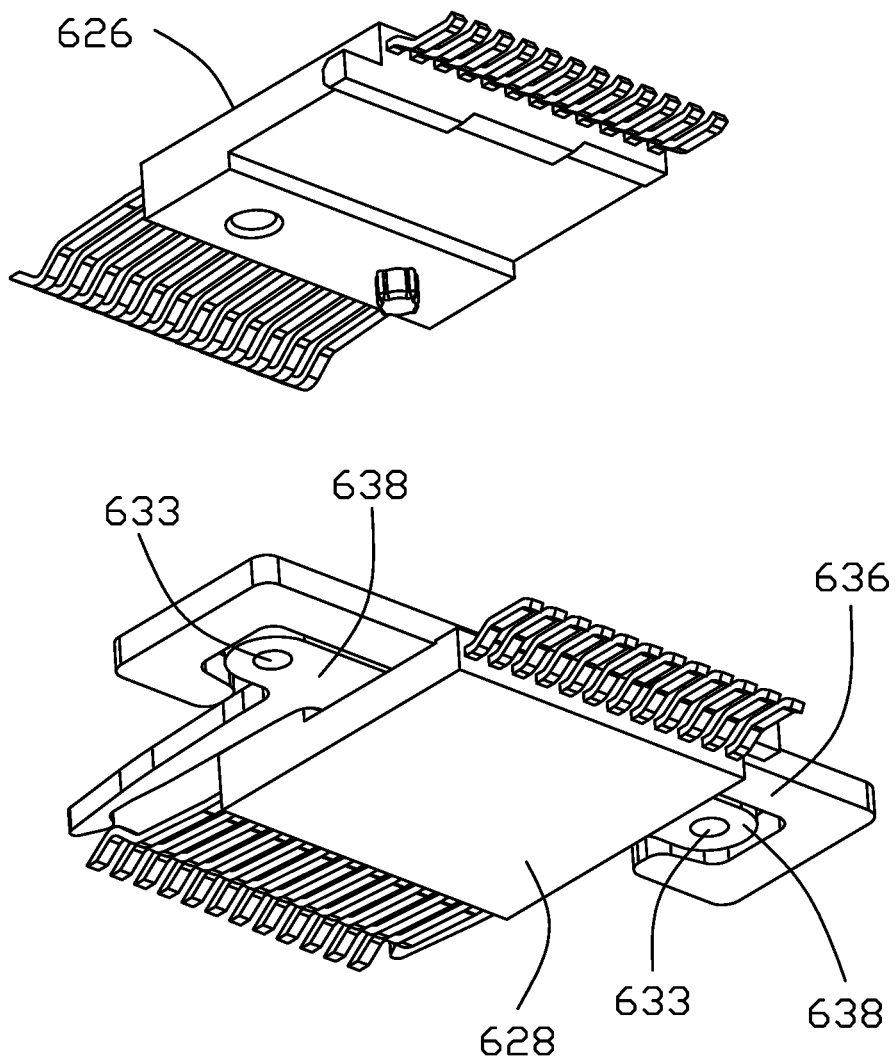
FIG. 7(B) is another exploded perspective view of the terminal module equipped with the actuator ant the latches of the special plug connector of FIG. 6(B)
Figure 9:
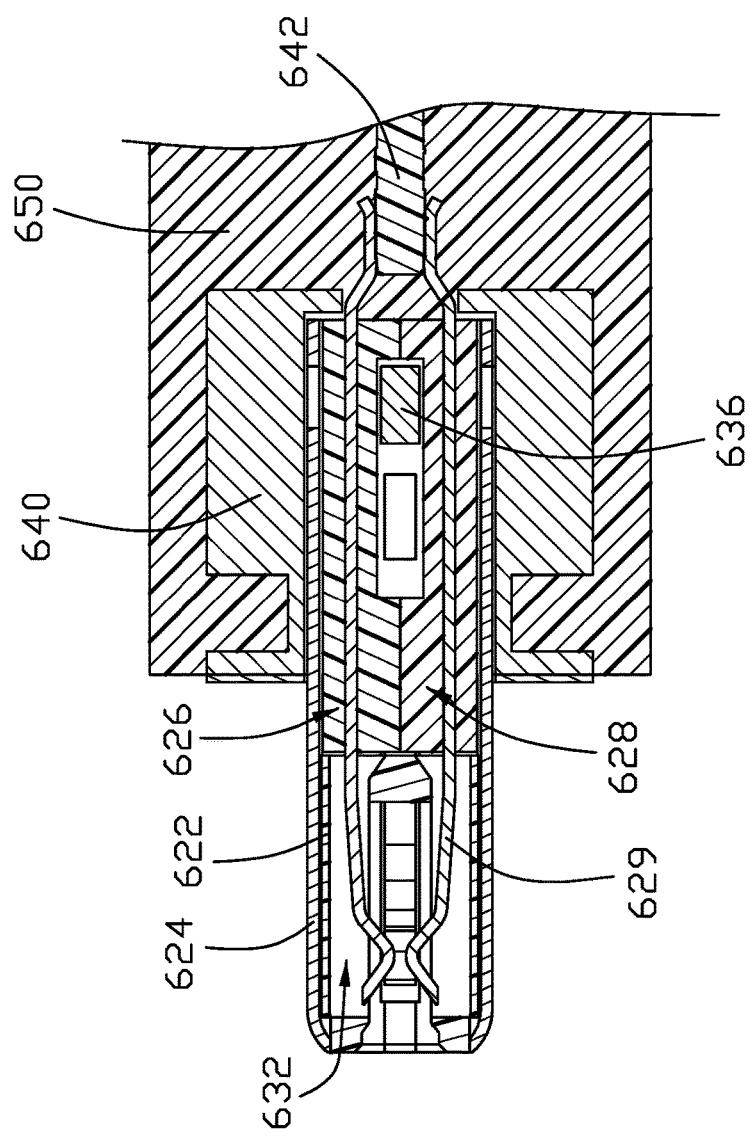
FIG. 9 is a cross-sectional view of the special plug connector of FIG. 3(A) taken lines 9-9 in FIG. 2(B)
Figure 10:
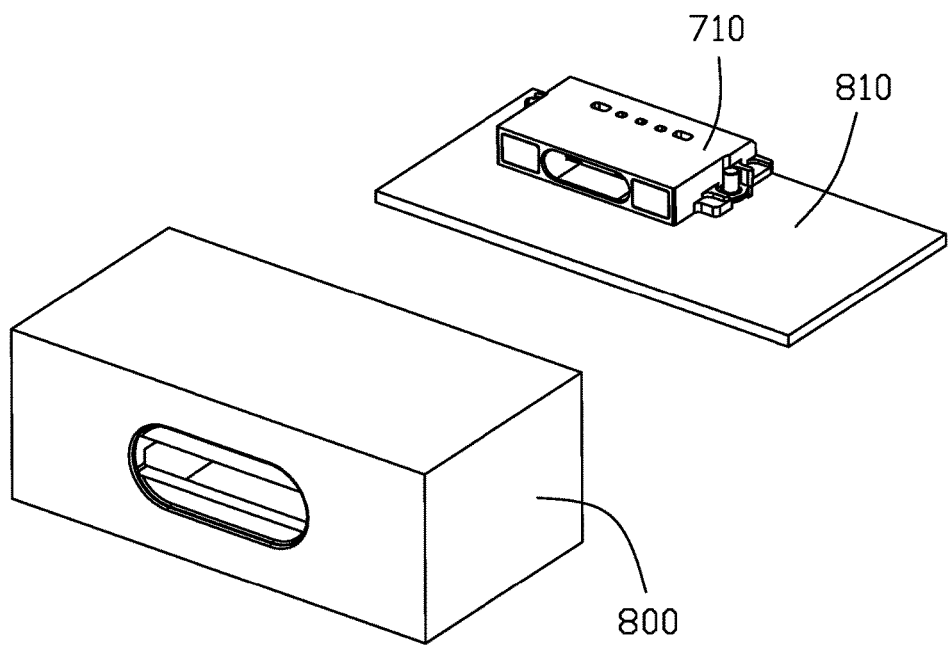
FIG. 10 is a perspective view of the special receptacle connector of the electrical connector assembly of FIG. 1.
Figure 11A:
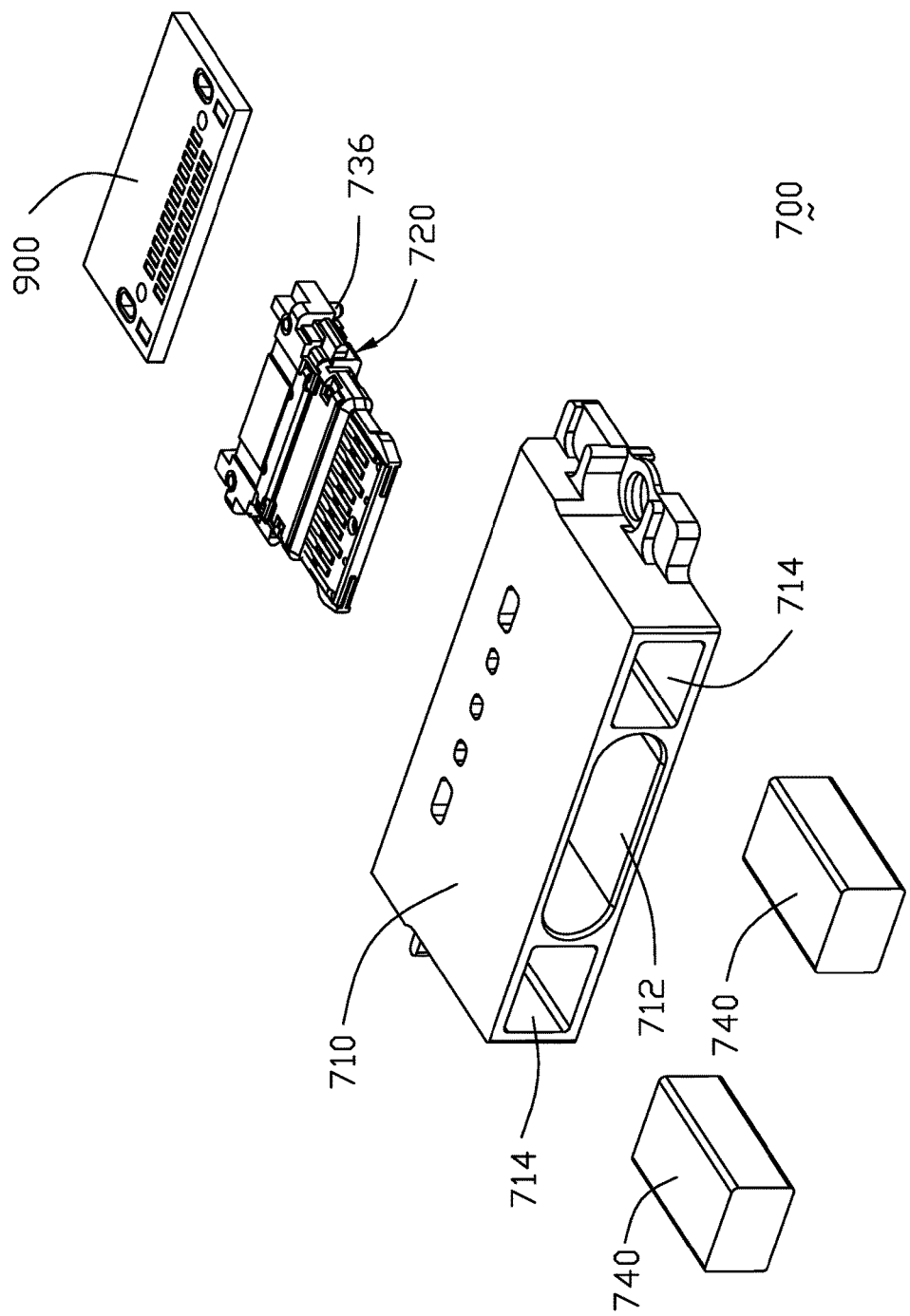
FIG. 11(A) is an exploded perspective view of the special receptacle connector of FIG. 10.
Figure 11B:
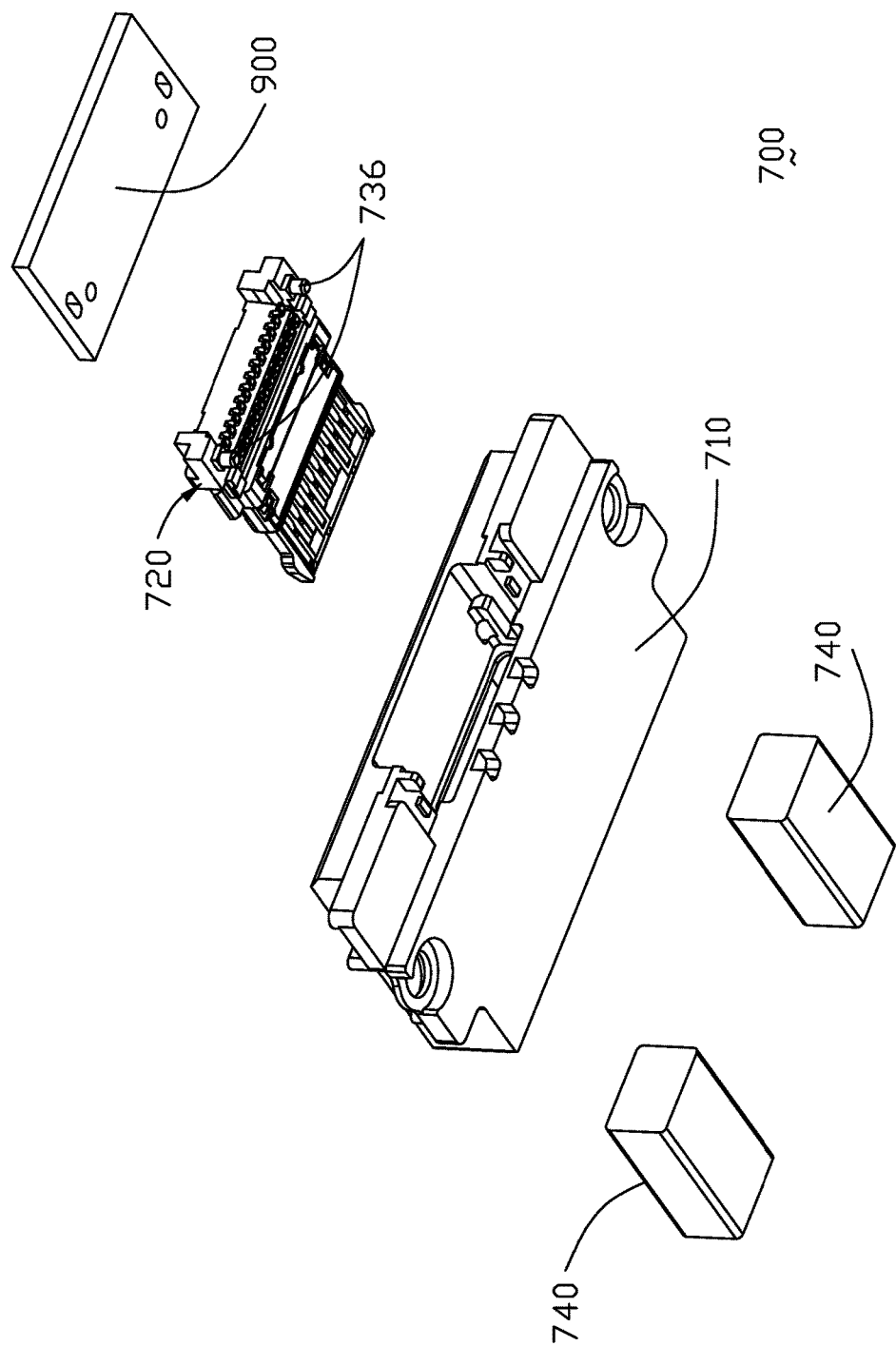
FIG. 11(B) is another exploded perspective view of the special receptacle connector of FIG. 10.
Figure 12A:
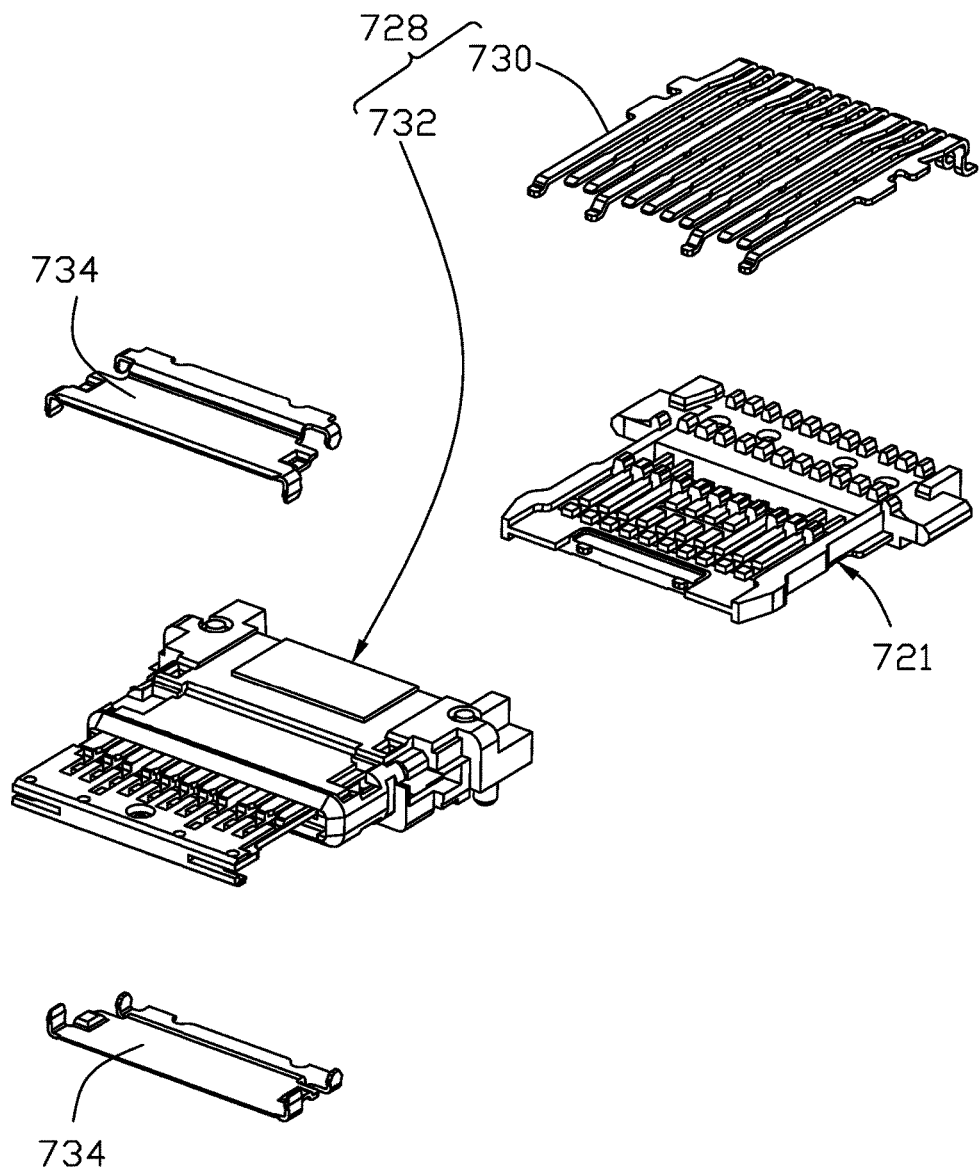
FIG 12(A) is an exploded perspective view of the terminal assembly of the special receptacle connector of FIG. 11(A)
Figure 12B:
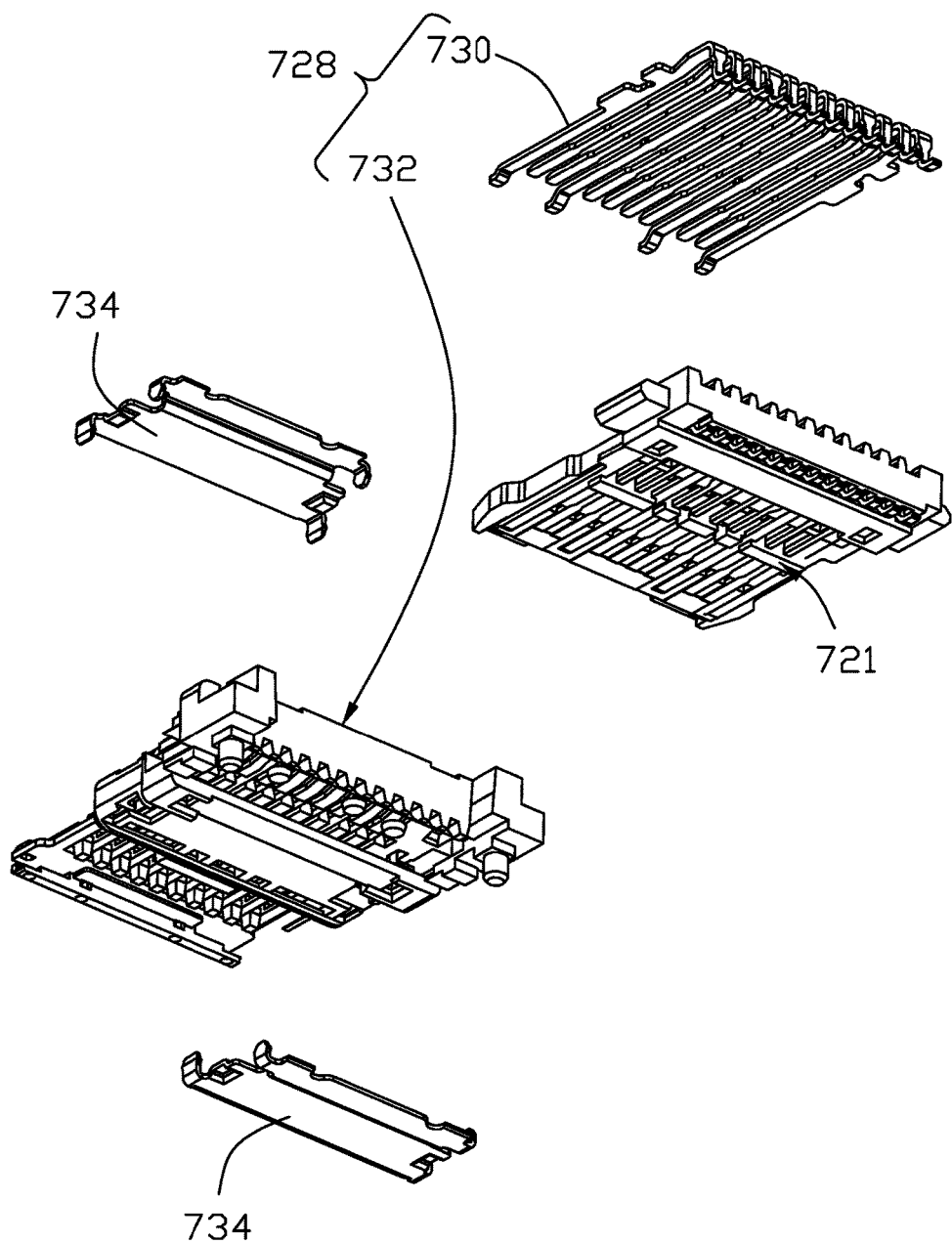
FIG. 12(B) is another exploded perspective view of the terminal assembly of the special receptacle connector of FIG. 11(B)
Figure 13A:
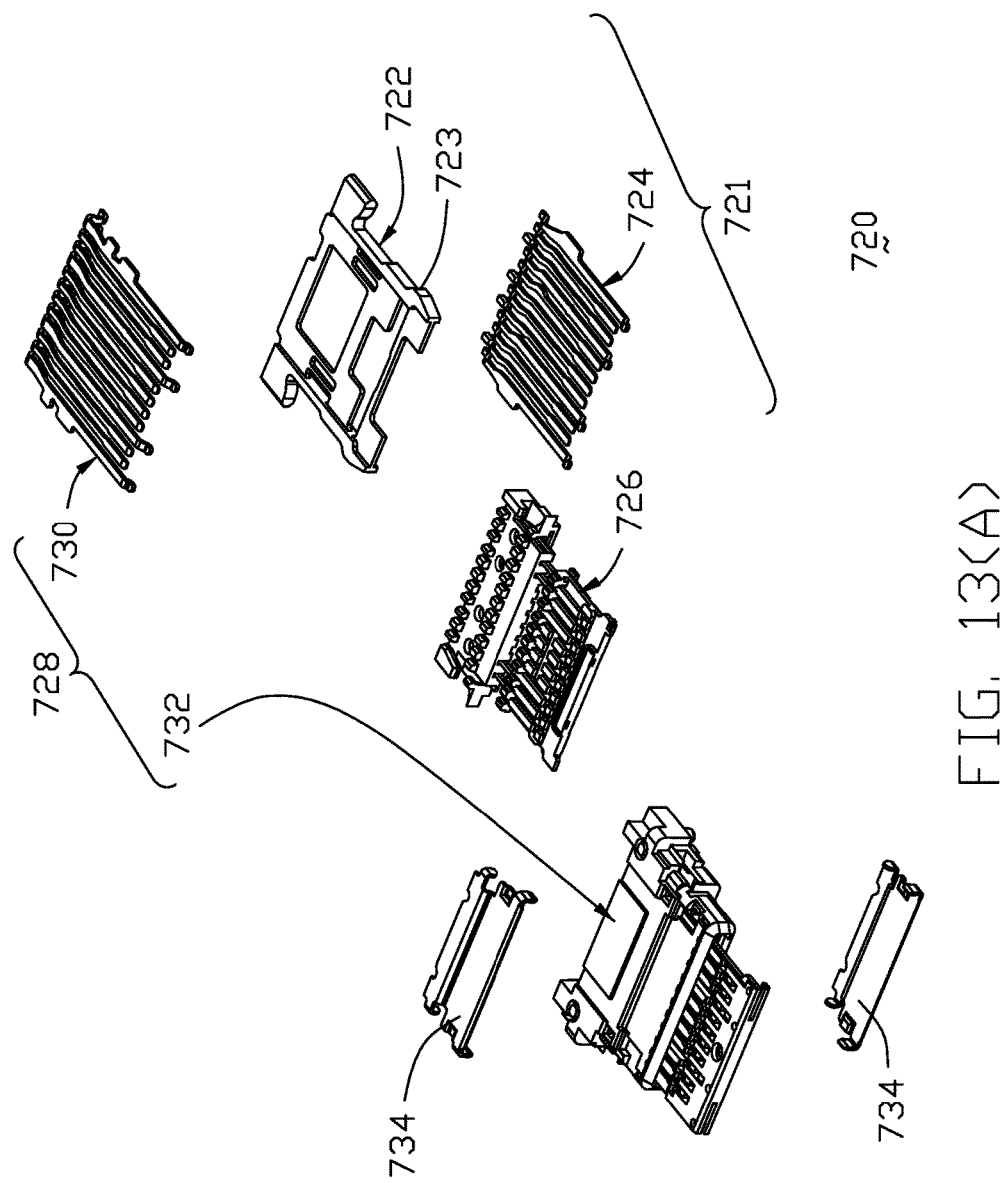
FIG. 13(A) is a further exploded perspective view of the terminal assembly of the special receptacle connector of FIG. 12(A)
Figure 13B:
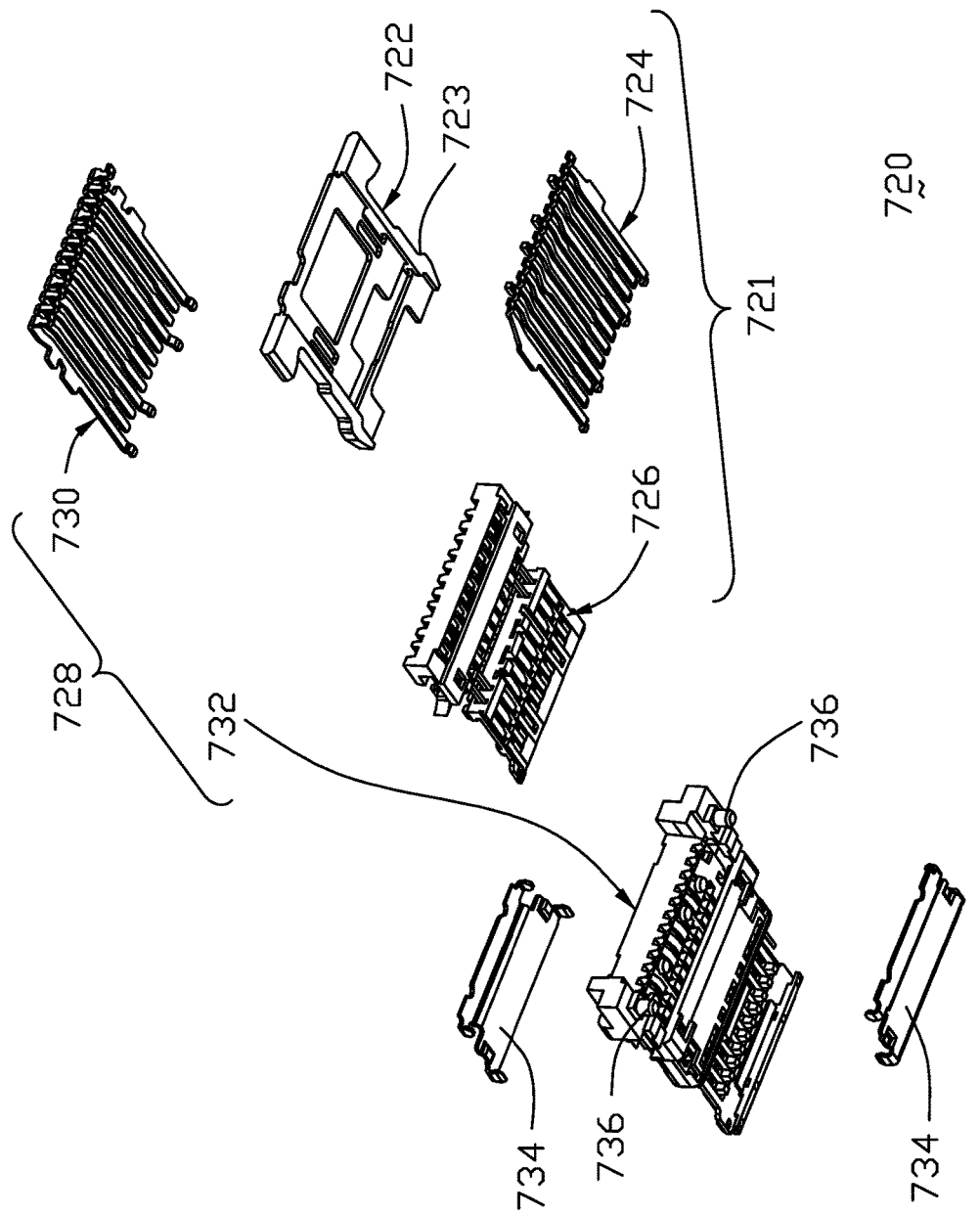
FIG. 13(B) is another further exploded perspective view of the terminal assembly of the special receptacle connector of FIG. 12(B)
Figure 14:
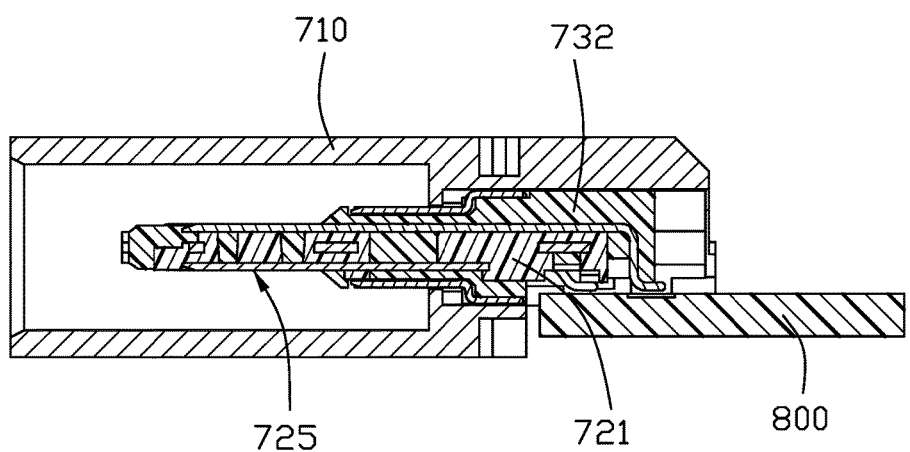
FIG. 14 is a cross-sectional view of the special receptacle connector of FIG. 10.

Referring to FIG. 1 through FIG. 16(D) illustrating a first embodiment of this present invention, the electrical connector assembly 500 includes a special plug connector 600 linked with a cable (not shown) and a special receptacle connector 700 mounted in an enclosure body 800 associated with an enclosure cover 810. The special plug 600 includes a mating part 610 received within a metallic base 640. In this embodiment, the metallic base 640 may be discretely made first and successively the mating part 610 is retainably assembled therein. Alternately, the mating part 610 may be integrally formed within the metallic base 640 via a metal injection molding process during forming the metallic base 640, if some external factors are met for implementation. The mating part 610 includes a terminal module 620 forwardly retainably assembled into an insulative housing 622 and commonly retainably enclosed in a metallic shell 624. The terminal module 620 includes a first piece 626 and a second piece 628 assembled with each other to commonly form a receiving space 6281 to receive/retain an actuator 636 and a pair of pivotal latches 638 therein wherein the pivotal latches 638 are moveably linked to the actuator 636. In this embodiment, the latches 638 are pivotally mounted with regard to the base 640 via the pair of pivotal pin 647 which extends through the holes 649 of the base 640 and the holes 633 of the latches 638. Understandably, in this embodiment the pivotal pin 647 not only functions as a pivot for rotation of the latch 538 but also helps to retain the mating part 610 in position in the base 640.

The actuator 636 is made of magnet and forms a front face 637 for coupling to a magnet of the special receptacle connector (illustrated later), and a rear face 639 for coupling to the metallic base 640. Notably, the actuator 636 extends sidewardly beyond two lateral sides of the housing 622 and associated metallic shell 624, and the base 640 further includes a pair of grooves 641 addition to the receiving room 643, which receives the associated housing 622 and shell 624, to receive the laterally exposed actuator 636. The pivotal latch 638 forms a hook 635 at the free end for locking with the locking notch of the standard receptacle connector (illustrated later). Each of the first piece 626 and the second piece 628 includes an insulator 627 with a plurality of terminals 629 embedded therein via an insert-molding process wherein the receiving space is formed by the insulators 627. The housing 622 forms a plurality of passageways 630 to receive the corresponding terminals 629 and a mating space 632 to receive a mating tongue of the special/standard receptacle connector (illustrated later) wherein the terminals 629 and the pair of latches 638 extend into the mating space 632.

The actuator 636 includes a transverse bar 6361 and a pair of L-shaped stopping portion 6362 and two first bite portions 6363 extending from the middle portion of the transverse bar 6361. Each latch 638 includes a short bar 6381 in front of the transverse bar 6361, a second bite portions 6382 of recess shape defined at rear edge of the inside of the short bar 6381 and a latching arm 6383 extending forward from the short bar, the first and second bite portions are engaged, arriving the linkage of the pair of latch 638 and the actuator 636 wherein the pair of latch 638 are located in the actuator 636.

A paddle card 642 is located behind the terminal module 620 and electrically and mechanically connected to the terminals 629. A face plate 645 is attached upon a front face of the base 640. An overmold 650 is molded upon the base 640 and the paddle card 642 while exposing the mating portion of the mating part 610. Understandably, via modification the overmold 650 may further directly contact and retain the mating part 610 for reinforcing the retention among the different parts, if necessary.

The special receptacle connector 700 is essentially similar to the traditional receptacle connector except further equipped with a pair of magnets illustrated later. The special receptacle connector 700 includes a shielding structure 710, made of metal in this embodiment while alternately of insulation if desired, defining a main receiving cavity 712 to receive a contact module 720 and a pair of subsidiary receiving cavity 714 located by two sides of the main receiving cavity 712 to receive the corresponding pair of magnets 740. The contact module 720 includes a primary piece 721 having a metallic/die-casting shielding plate 722, which is made by metal injection molding or die-casting or forging, and a plurality of lower contacts 724 integrally formed within a first insulating part 726 via a first stage insert-molding process, and further includes a secondary piece 728 having a plurality of upper contacts 730 positioned upon the upper face of the primary piece 720 and a second insulating part 732 applying upon both the primary piece 720 and the upper contacts 730 to form the whole contact module 720. Successively, a pair of metallic collars 734 are oppositely assembled upon the contact module 720. A printed circuit board 900 is located behind the shielding structure 710 on which the contact tails are soldered and the posts 736 on the are mounted. Notably, the contact module 720 forms a mating tongue 725 extending in the receiving cavity 710. As the traditional receptacle connector, the shielding plate 722 forms a pair of locking notch 723 at two opposite lateral sides.

Figure 15A:
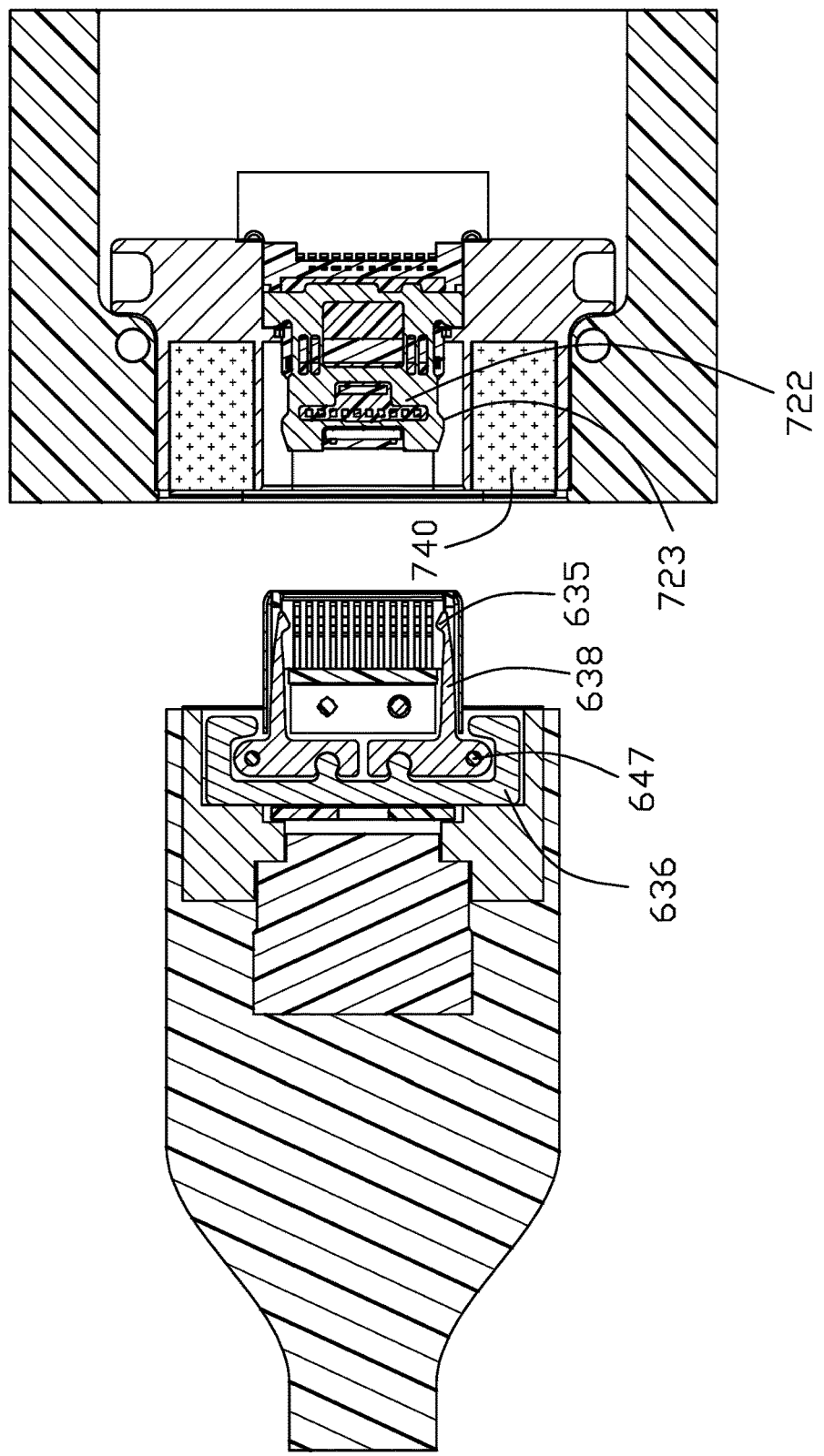
FIG. 15(A) is a cross-sectional view of the special plug connector and the special receptacle connector of the electrical connector assembly of FIG. 1 ready to be mated with each other.
Figure 15B:
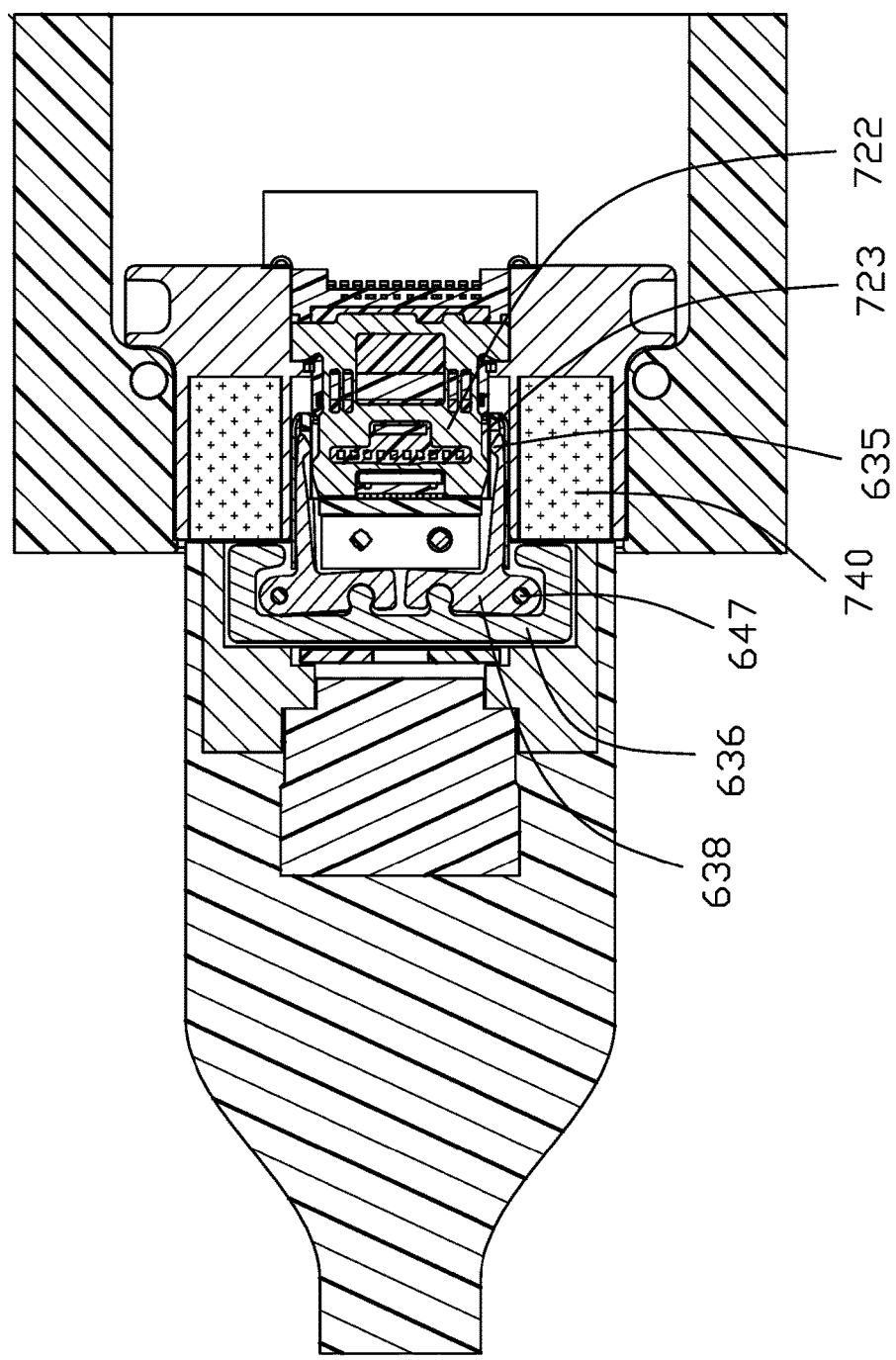
FIG. 15(B) is a cross-sectional view of the special plug connector and the special receptacle connector of the electrical connector assembly mated with each other.

As shown in FIG. 15(A), in the special plug connector 600 normally the actuator 636 is located at a rear position because of the magnetic attraction force between the rear face 639 and the base 640. Therefore, the hook 635 of the latch 638 is located at an inward/inner position. As shown in FIG. 15(B), when the special plug connector 600 is mated with the special receptacle connector 700 by having the mating portion of the special plug 600 received in the main receiving cavity 712 and having the mating tongue 725 received in the mating space 632, the magnetic attraction force occurring between the front face 637 of the actuator 636 and the magnets 740 is larger than that between the rear face 639 of the actuator 636 and the base 640, thus urging the actuator 636 to move toward the special receptacle connector 700. Simultaneously, due to linkage between the actuator 636 and the latch 638, the latch 638 is moved pivotally about the pivotal pin 647 and the hook 635 of the latch 638 is moved to be located at the outward/outer position. Therefore, there is less or no retention between the hooks 635 and the corresponding locking notches 723, and the special plug connector 600 and the special receptacle connector 700 are retained to each other via the magnetic forces between the magnets 740 and the actuator 636 in a so-called zero insertion force state.

Figure 16B:
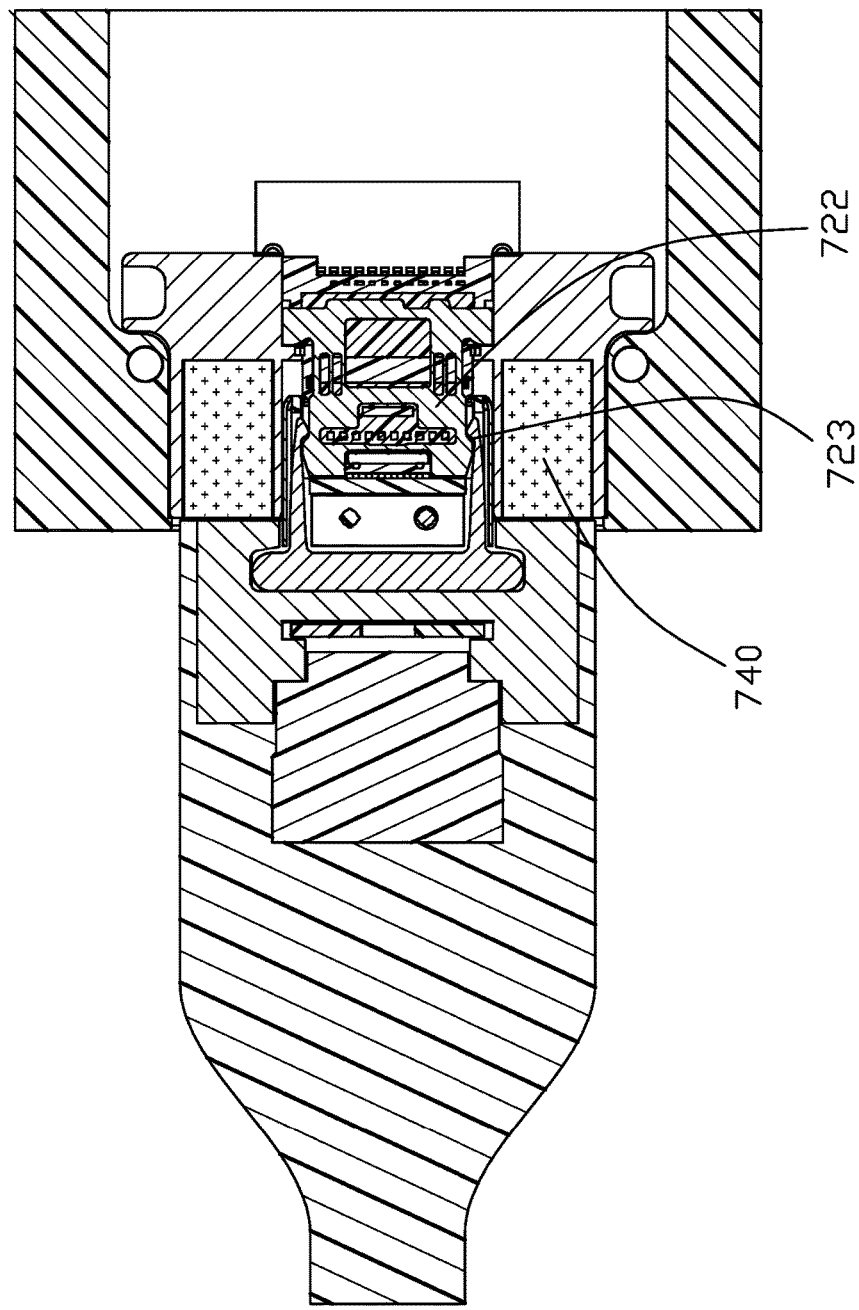
FIG. 16(B) is a cross-sectional view of the special receptacle connector of FIG. 10 mated with standard plug connector.
Figure 17:
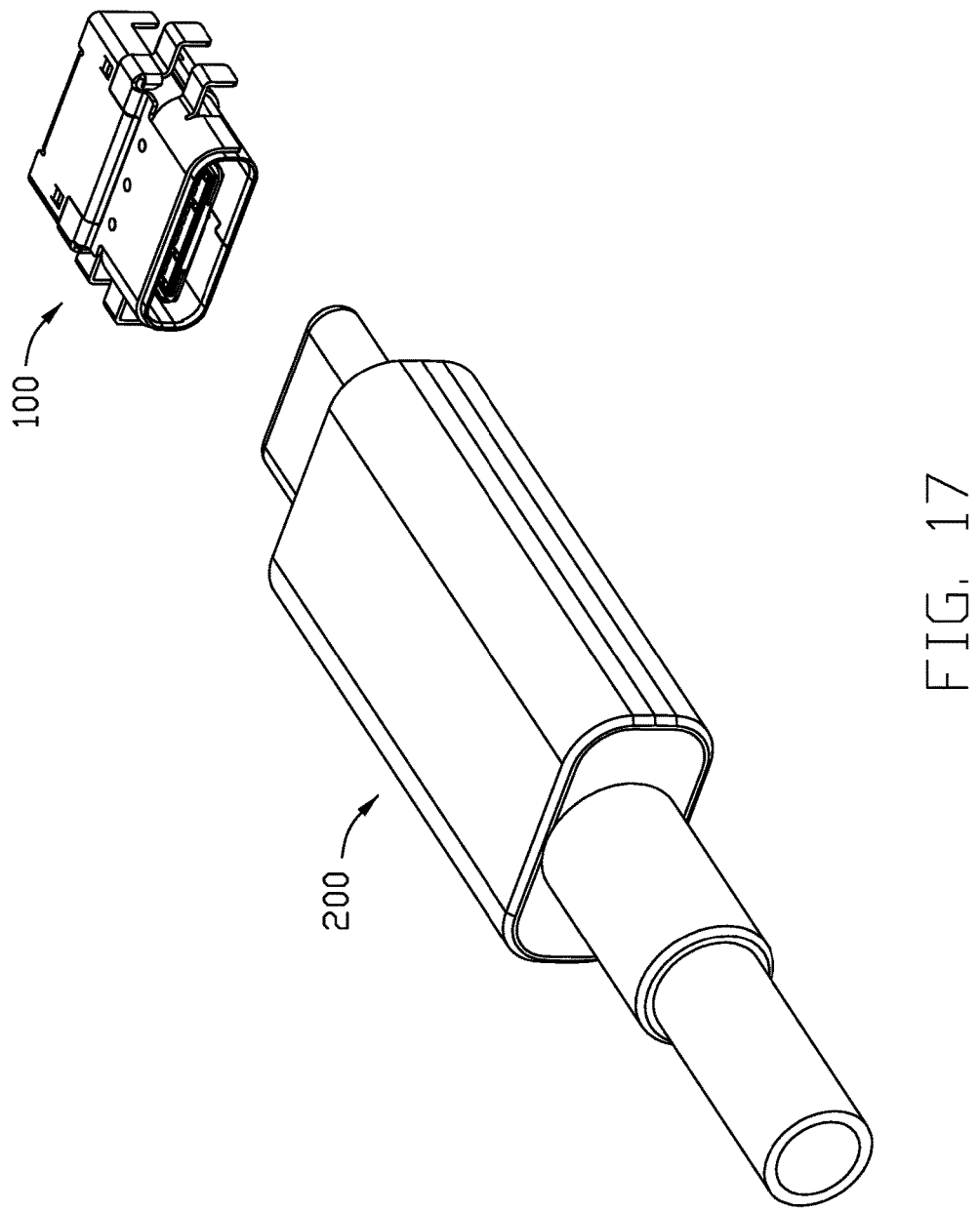
FIG. 17 is a perspective view of an electrical connector assembly of the instant invention according to the a second embodiment, including a special plug connector, and a special receptacle connector mounted upon a printed circuit board and separated with the special plug connector.
Figure 18:
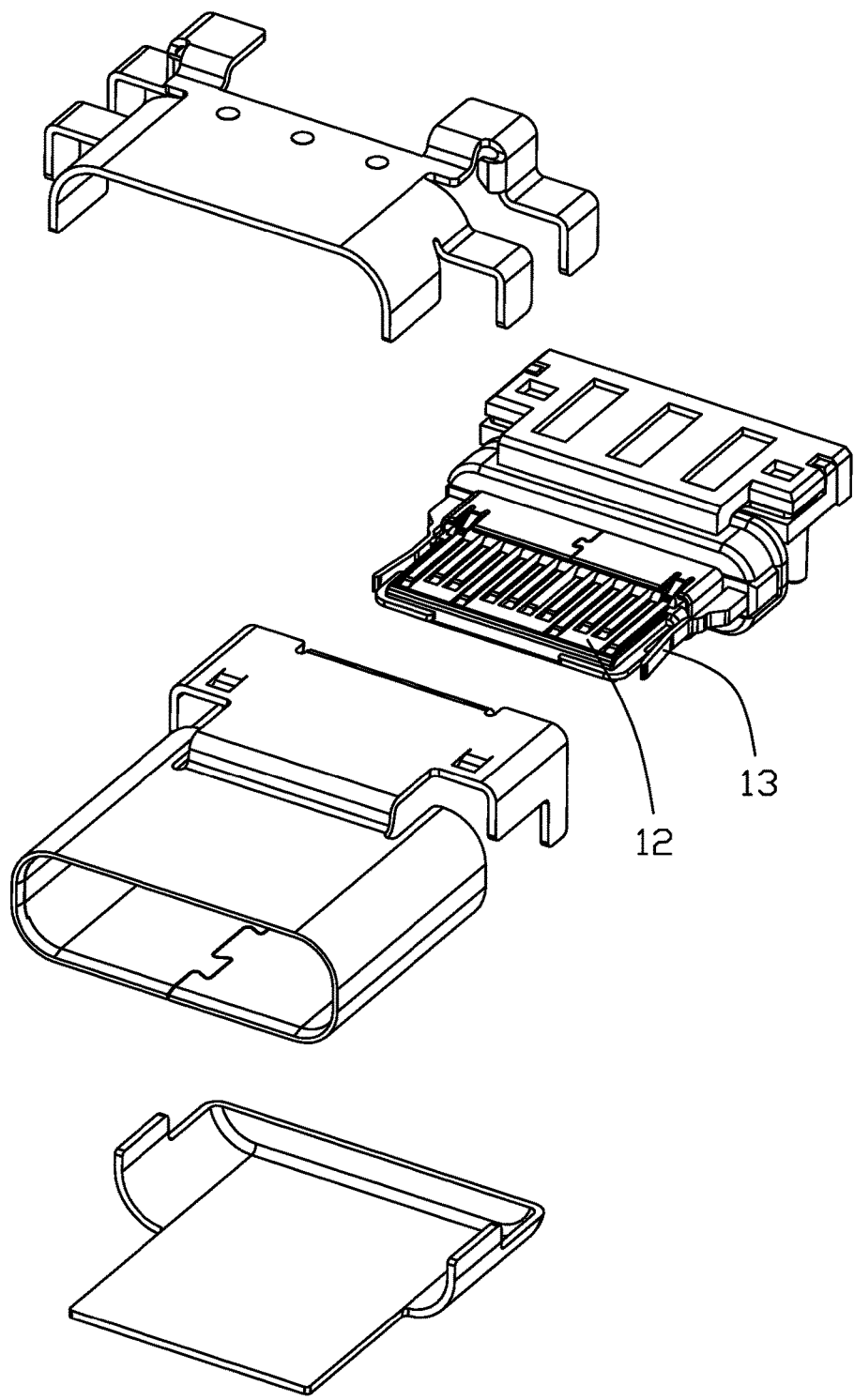
FIG. 18 is an exploded perspective view of the receptacle as shown in FIG. 17.
Figure 20A:
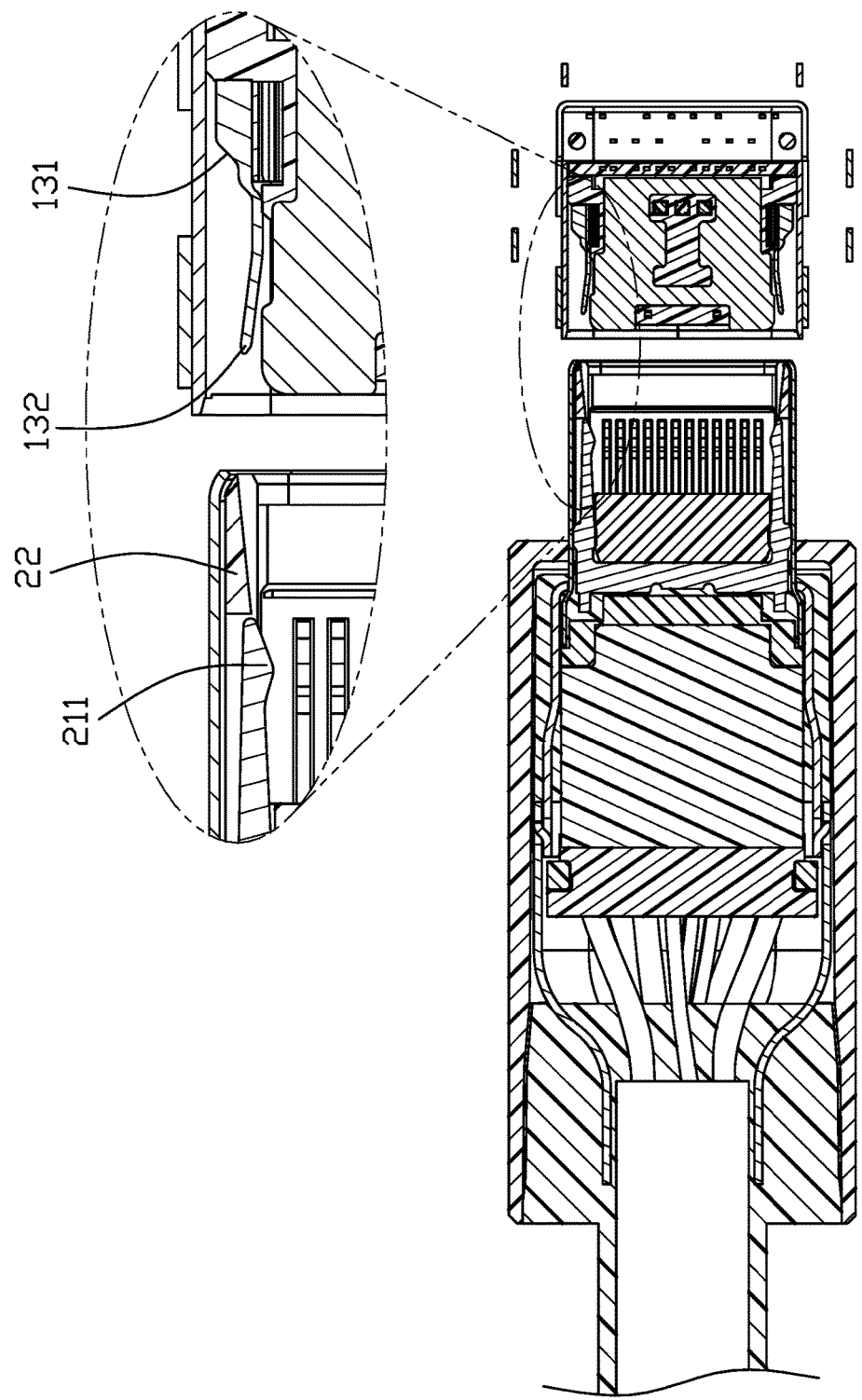
FIGS. 20(A), 20(B), 20(C) and 20(D) show how the special plug connector is mated with the special receptacle connector without latchable engagement therebetween.
Figure 20B:
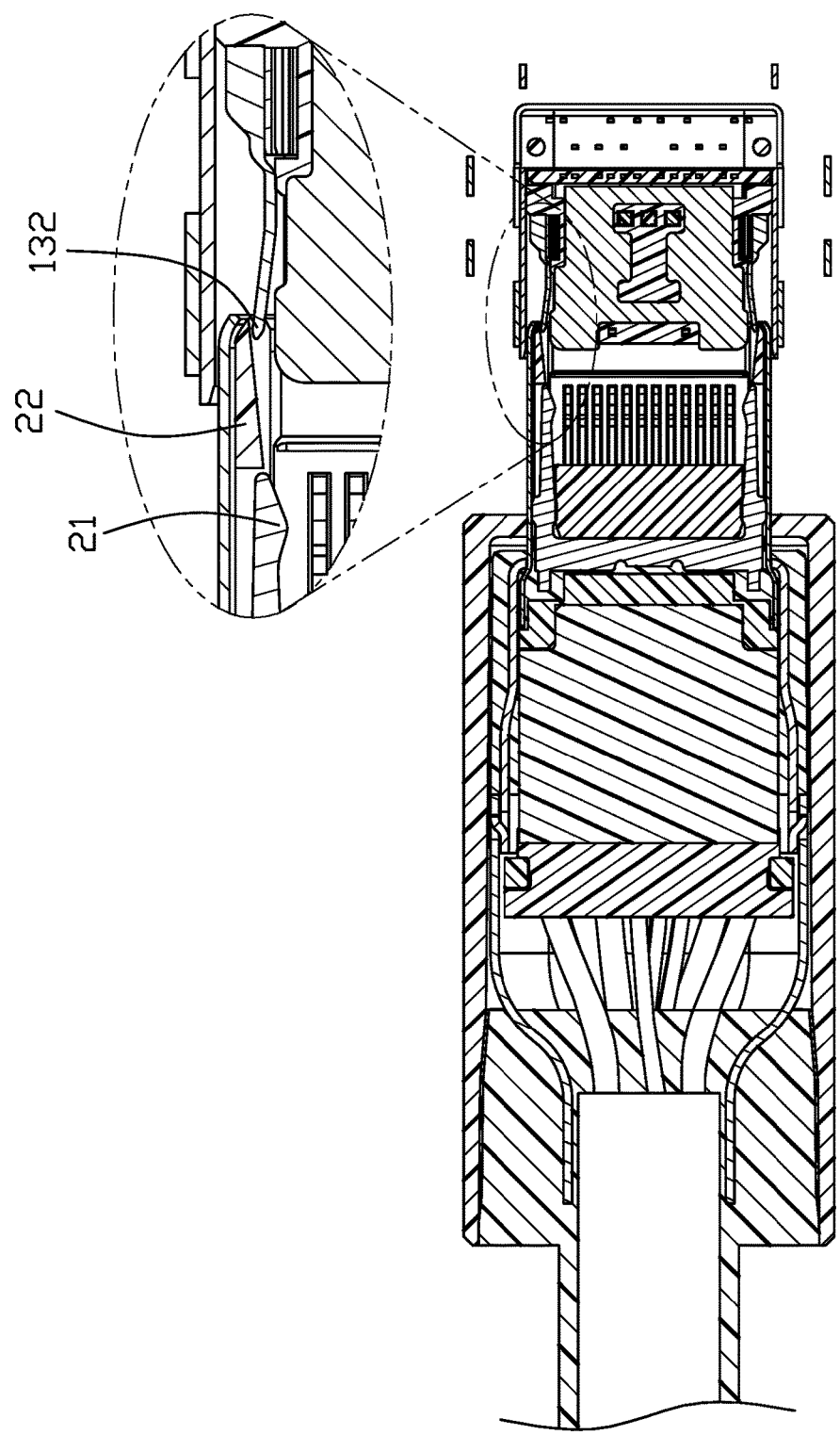
Figure 20C:
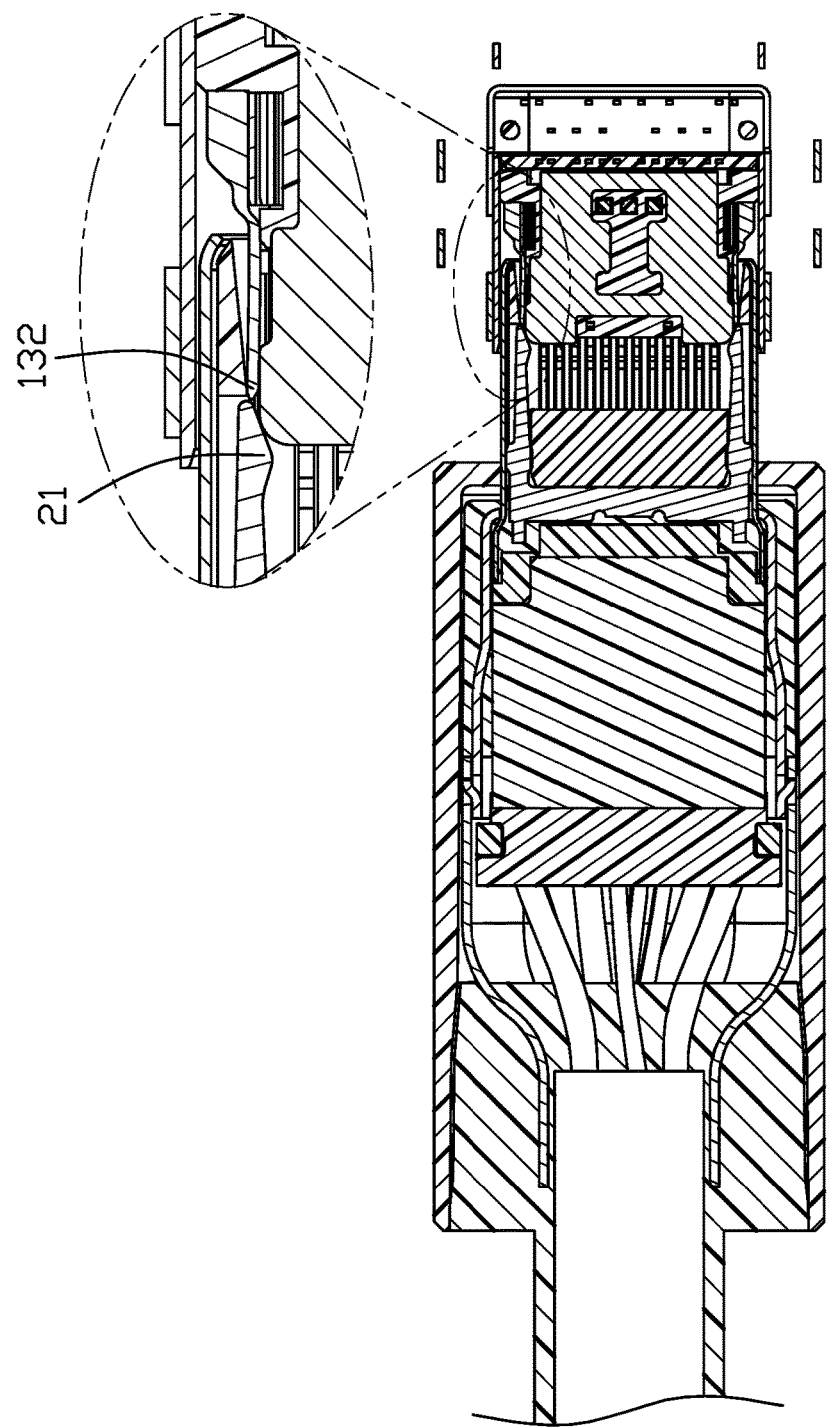
Figure 20D:
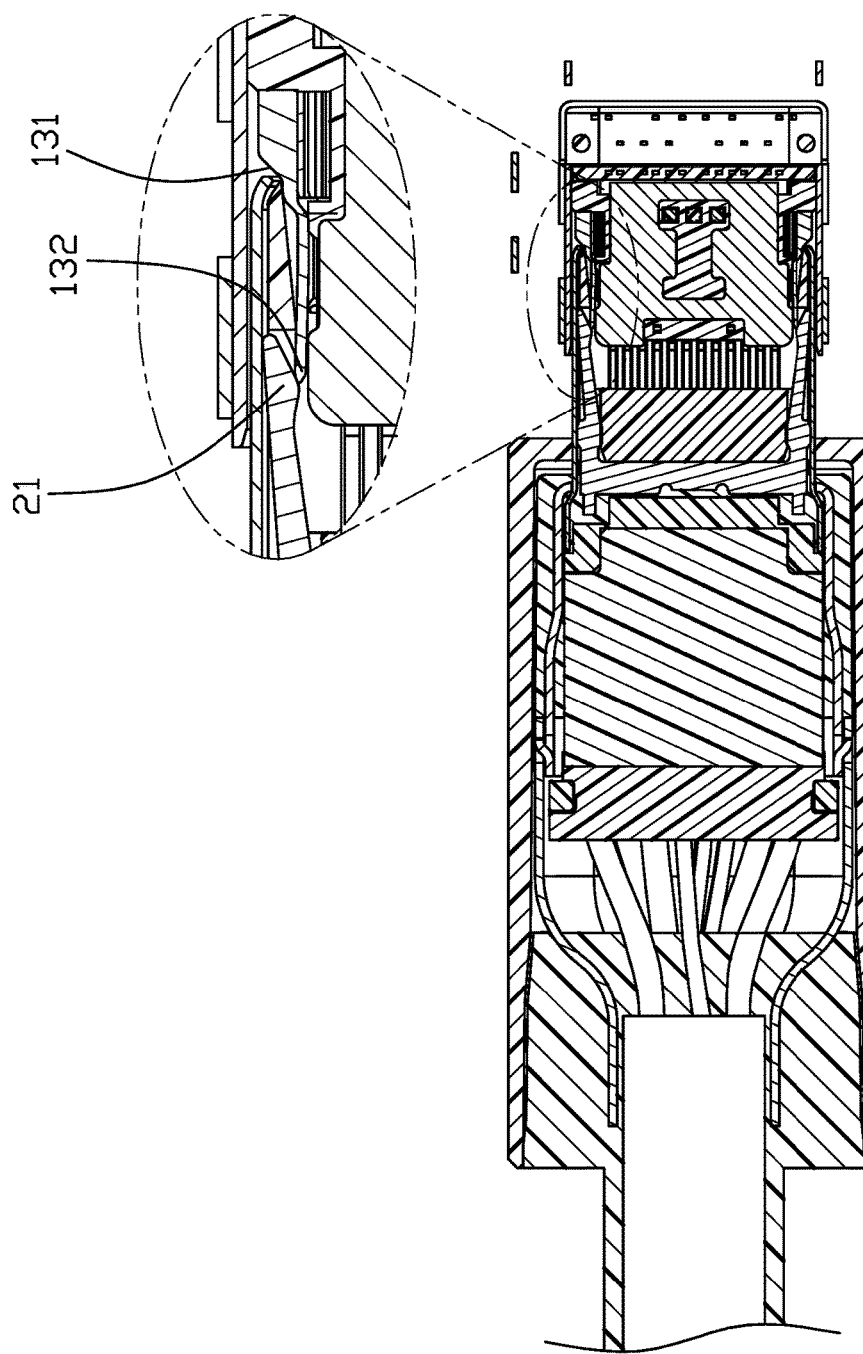

Differently, as shown in FIG. 16(A), when the special plug connector is mated with the standard receptacle connector, because no magnetic attraction forces occurring between the standard receptacle connector and the special plug connector, the actuator 636 remains at the rear position and the hook 635 of the pivotal latch 638 of the special plug connector remains at the inward/inner position, thus being engaged within the corresponding locking notch of the shielding plate of the receptacle connector. Similarly, as shown in FIG. 16(B), the special receptacle connector is mated the standard plug connector, because no magnetic attraction forces occur therebetween and the latch of the standard plug connector is always located at the inward/inner position, the hook of the latch of the standard plug connector is engaged within the locking notch 723 of the shielding plate 722 of the special receptacle connector 700.

The spirit of the invention is to provide the corresponding movable structures on the plug connector to achieve the same function. In this embodiment, the latch is pivotally moveable while other back-and-forth type movements, e.g., linear movement either sideward or backward, deflection or translation, may be alternatively used. Also, in this embodiment the magnetic forces between the rear face 639 of the actuator 636 and the base 640 for urging/keeping the actuator in the rear position may be replaced by the spring forces, e.g., using a torsion spring on the pivotal pin 647 to urge the corresponding latch 638 at the inner position, as long as the magnetic attraction forces between the special plug connector and the special receptacle connector is larger than such urging/keeping forces. One feature of the invention is to use the magnetic attraction force during mating as the initiating factor to simultaneously move the latch of the plug outwardly. Anyhow, using other type mechanical mechanism as what is shown in the previously aforementioned provisional application 62/502,802 with the mechanical confrontation between actuation/restriction device of the subject special and the complementary mating connector, are other solutions.

FIG. 17 through FIG. 20(D) illustrating a second embodiment of this present, the special receptacle connector 100 is similar to the standard USB Type-C receptacle connector except further equipped with a pair of latch restrictors 13 by two sides of the mating tongue 12 to cover the corresponding locking notches. The latch restrictors 13 are equipped with the (coil) springs (not shown) so as to be able to move along the front-to-back direction in a retractable manner. Anyhow, as long as having the moveability to expose the corresponding latch is desired. Correspondingly, the special plug connector 200 is similar to the standard type C plug connector except a pair of guidable cutout/slope 22 are formed in the front face/opening so as to receive the corresponding latch restrictors 13 and allow the corresponding latch restrictors 13 to enter the receiving cavity of the special plug connector and block the corresponding latches of the special plug connector from latchable engagement with the corresponding locking notch of the special receptacle connector. The latch restrictors 13 has a rear widened portion 131 located in the insulative housing and a front restricting portion 132. The front restricting portion 132 is disposed in the locking notch of the shielding plate.

However, the disclosure is illustrative only, changes may be made in detail, especially in matter of shape, size, and arrangement of parts within the principles of the invention.

What is claimed is:

1. An electrical special plug connector having a similar interface with a standard type C plug connector, comprising:
   a mating space, for receiving a mating tongue of a complementary receptacle connector, with a corresponding latch extending thereinto, and further equipped with a moveable actuator to move a corresponding latch away from the mating space toward an outer position when the actuator is affected by magnetic forces derived from a special receptacle connector equipped with a magnet so as to have the special plug connector mated with the special receptacle connector with magnetic forces but without interlocking engagement between the latch and a locking notch of the special receptacle connector while keeping the corresponding latch in an inner position to interlock with a locking notch of a standard type C receptacle connector;
   wherein the special plug connector is surrounded with a metallic base, the actuator is affected by magnet forces derived from the metallic base to keep the corresponding latch in said inner position when the special plug connector is in un-used situation; and
   wherein the actuator comprises a transverse bar, a pair of L-shaped stopping portions and two first bite portions extending from a middle portion of the transverse bar.

2. The electrical special plug connector as claimed in claim 1, wherein there are two corresponding latch latches each comprising a short bar in front of the transverse bar, a second bite portion of recess shape defined at a rear edge of the short bar and a latching arm extending forward from the short bar, the first and second bite portions are engaged, arriving a linkage of the pair of latch latches and the actuator.

3. The electrical special plug connector as claimed in claim 2, wherein the magnetic attraction force occurring between the front face of stopping portion and the magnets is larger than that between a rear face of the actuator and the base, thus urging the actuator to move toward the special receptacle connector.

4. The electrical special plug connector as claimed in claim 3, wherein the latch is pivotally mounted with regard to the base via a pivotal pin which extends through a hole of the base and the holes of the latches.

5. An electrical plug connector, comprising:
   a mating part defining a mating space and loaded with a plurality of terminals therein;
   a pair of distinct latches each defining a short transverse bar and a lathing arm extending forwards from the short transverse bar with a hook, the lathing arm extending into the mating part with the hook in the mating space, the short transverse bar defining a bite portion at an inner end thereof and a pivotal hole at outer end thereof;
   an actuator defining a transverse bar and a pair of another bite portions extending from a middle portion of the transverse bar; and
   a metallic base receiving the mating part, the pair of latches and the actuator; wherein the pair of the latches are linked with the actuator via the engagement of the bite portions of the latches and the bite portions of the actuator, the actuator is pivotally mounted with regard to the base via a pivotal pin which extends through a hole of the base and the holes of the latches, and the actuator is made of magnet so that magnetic attraction force occurring between the actuator and the metallic base;

wherein the metallic base defines a receiving room and two grooves, the mating part with the latches and the actuator are received in the receiving room and the outer ends of the latches and the transverse extend beyond two opposite lateral sides of the mating part and received in the grooves.

6. The electrical plug connector as claimed in claim 5, wherein the mating part comprise an insulative housing, a terminal module inserted to the insulative housing and a metallic shell fitly surrounding the terminal module, the terminal module comprises a first piece and a second piece assembled with each other to commonly form a receiving space to receive the actuator and the pair of pivotal latches therein.

7. An electrical assembly comprising a special plug connector and an electrical special receptacle connector having a similar interface with a standard type C receptacle connector, the electrical special receptacle connector comprising: a shielding structure defining a primary receiving cavity receiving a contact module therein and a secondary receiving cavity beside the main receiving cavity to receive a magnet, the contact module forming a locking notch;

wherein the magnet is interacted with an actuator of the special plug connector which has a similar interface with a standard plug connector, to have said actuator move a movable latch of the special plug connector to an outer position for not interlocking within the locking notch while allowing a latch of the standard plug connector which is essentially in a constantly fixed manner to interlock within the locking notch thereof;

wherein the special plug connector is surrounded with a metallic base, the actuator is affected by magnet forces derived from the metallic base to keep the corresponding latch in said inner position when the special plug connector is in un-used situation; and wherein the actuator comprises a transverse bar, a pair of L-shaped stopping portions and two first bite portions extending from a middle portion of the transverse bar.

8. The electrical special plug connector as claimed in claim 1, wherein the corresponding latch is pivotally moveable relative to the mating space.

9. The electrical special plug connector as claimed in claim 8, wherein said corresponding latch is located in front of the actuator.

10. The electrical special plug connector as claimed in claim 9, wherein said actuator is moveable along a front-to-back direction.

11. The electrical special plug connector as claimed in claim 10, wherein said actuator and the corresponding latch are coupled with each other.

* * * * *